United States Patent
Lin et al.

(10) Patent No.: US 9,397,098 B2
(45) Date of Patent: Jul. 19, 2016

(54) FINFET-BASED ESD DEVICES AND METHODS FOR FORMING THE SAME

(71) Applicant: Taiwan Semiconductor Manufacturing Company, Ltd., Hsin-Chu (TW)

(72) Inventors: Wun-Jie Lin, Hsin-Chu (TW); Ching-Hsiung Lo, San Jose, CA (US); Jen-Chou Tseng, Jhudong Township (TW); Han-Jen Yang, Taipei (TW); Arabinda Das, Ottawa (CA)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/555,423

(22) Filed: Nov. 26, 2014

(65) Prior Publication Data

US 2015/0084134 A1     Mar. 26, 2015

Related U.S. Application Data

(63) Continuation-in-part of application No. 14/310,934, filed on Jun. 20, 2014, now Pat. No. 9,190,519, which is a continuation of application No. 13/415,552, filed on Mar. 8, 2012, now Pat. No. 8,779,517.

(60) Provisional application No. 62/049,236, filed on Sep. 11, 2014.

(51) Int. Cl.
*H01L 21/02*     (2006.01)
*H01L 27/088*     (2006.01)
(Continued)

(52) U.S. Cl.
CPC .... *H01L 27/0886* (2013.01); *H01L 21/823431* (2013.01); *H01L 27/027* (2013.01); *H01L 27/0266* (2013.01); *H01L 29/41791* (2013.01); *H01L 29/42372* (2013.01); *H01L 29/45* (2013.01); *H01L 29/785* (2013.01)

(58) Field of Classification Search
CPC ............ H01L 27/0886; H01L 27/0248; H01L 27/027; H01L 27/0266; H01L 29/41791; H01L 29/785
See application file for complete search history.

(56) References Cited

U.S. PATENT DOCUMENTS

| | | |
|---|---|---|
| 7,465,995 B2 | 12/2008 | Chu et al. |
| 2004/0007742 A1 | 1/2004 | Cheng et al. |

(Continued)

FOREIGN PATENT DOCUMENTS

| | | |
|---|---|---|
| JP | 2011258934 A | 12/2011 |
| KR | 20060111858 A | 10/2006 |

(Continued)

*Primary Examiner* — Reema Patel
*Assistant Examiner* — Syed Gheyas
(74) *Attorney, Agent, or Firm* — Slater Matsil, LLP

(57) ABSTRACT

A semiconductor device includes semiconductor fins on semiconductor strips on a substrate. The semiconductor fins are parallel to each other. A gate stack is over the semiconductor fins, and a drain epitaxy semiconductor region is disposed laterally from a side of the gate stack and on the semiconductor strips. A first dielectric layer is over the substrate, and the first dielectric layer has a first metal layer. A second dielectric layer is over the first dielectric layer, and the second dielectric layer has a second metal layer. Vias extend from the second metal layer and through the first dielectric layer, and the vias are electrically coupled to the drain epitaxy semiconductor region.

20 Claims, 31 Drawing Sheets

(51) Int. Cl.
*H01L 29/45* (2006.01)
*H01L 29/417* (2006.01)
*H01L 21/8234* (2006.01)
*H01L 29/423* (2006.01)
*H01L 27/02* (2006.01)
*H01L 29/78* (2006.01)

(56) References Cited

U.S. PATENT DOCUMENTS

2006/0240657 A1 10/2006 Aiso
2009/0035909 A1 2/2009 Chang et al.
2009/0101968 A1* 4/2009 Sugioka ............ H01L 29/41791
　　　　　　　　　　　　　　　　　　　　　257/327
2009/0315112 A1 12/2009 Lee
2010/0015778 A1 1/2010 Lin et al.
2011/0298058 A1 12/2011 Kawasaki et al.

FOREIGN PATENT DOCUMENTS

TW 200905875 A 2/2009
TW 201013838 A 4/2010

* cited by examiner

US 9,397,098 B2

FINFET-BASED ESD DEVICES AND METHODS FOR FORMING THE SAME

This application claims the benefit of U.S. Provisional Application No. 62/049,236, filed on Sep. 11, 2014, entitled "FinFET-Based ESD Devices and Methods for Forming the Same," which application is hereby incorporated herein by reference in its entirety.

This application is a continuation-in-part of U.S. patent application Ser. No. 14/310,934, filed on Jun. 20, 2014, entitled "FinFET-Based ESD Devices and Methods for Forming the Same," which is a continuation of U.S. patent application Ser. No. 13/415,552, filed on Mar. 8, 2012, now U.S. Pat. No. 8,779,517, entitled "FinFET-Based ESD Devices and Methods for Forming the Same;" which applications are hereby incorporated herein by reference in their entireties.

BACKGROUND

Extremely high voltages can develop in the vicinity of integrated circuits due to the build-up of static charges. A high potential may be generated to an input buffer or an output buffer of an integrated circuit. The high potential may be caused by a person touching a package pin that is in electrical contact with the input or the output buffer. When the electrostatic charges are discharged, a high current is produced at the package nodes of the integrated circuit. This phenomenon is referred to as ElectroStatic Discharge (ESD). ESD is a serious problem for semiconductor devices since it can potentially destroy the entire integrated circuit.

The duration of the ESD transient is very short, typically in the order of nanoseconds, and the conventional circuit breakers cannot react quickly enough to provide adequate protection. For this reason, it has become a known practice to incorporate ESD devices in integrated circuits. Conventionally, bi-directional diode strings were coupled between the package pins to protect the respective circuit. Other ESD devices such as transistors were also used. The ESD devices were also widely used between power lines to protect the internal circuits coupled between the power lines and to discharge ESD currents to the ground.

Fin Field-Effect Transistor (FinFET) structures may be used for forming the ESD devices. To make the process for forming ESD devices compatible with the formation of FinFET structures, FinFETs were connected to construct the ESD protection circuits, wherein the channels of the ESD FinFETs were used to conduct ESD currents. This approach, unfortunately, faces design and process issues. To provide the high ESD protection capability, a great number of FinFET devices, sometimes as many as over 10,000 FinFETs, need to be connected in parallel. This means that the breakdown of any one of these FinFETs may cause the entire ESD protection circuit to malfunction. The FinFETs thus need to be turned on uniformly.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) based ElectroStatic Discharge (ESD) device and the methods of forming the same are provided in accordance with various exemplary embodiments. Intermediate stages of forming the ESD device are illustrated. Some variations of the embodiments are discussed. Additionally, some applications in which a FinFET based ESD device may be used are also discussed. Throughout the various views and illustrative embodiments, like reference numbers are used to designate like elements.

Figure 1:
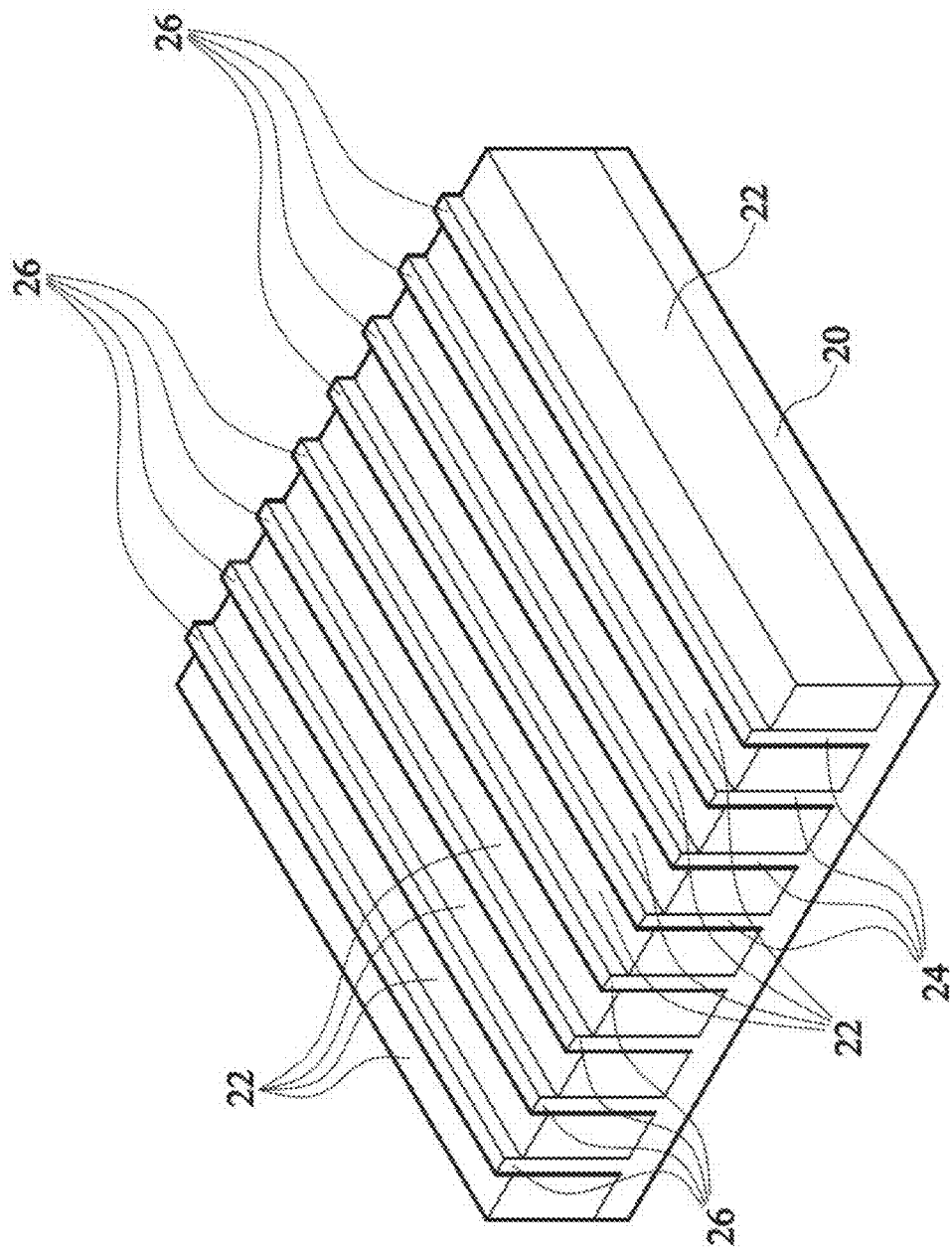
FIGS. 1 through 3, 4A through 4D, and 5A through 5H are cross-sectional views, perspective views, and top view of intermediate stages in the manufacturing of an ElectroStatic Discharge (ESD) device in accordance with some exemplary embodiments.

FIGS. 1 through 5H illustrate perspective views, top views, and cross-sectional views of intermediate stages in the formation of the ESD devices in accordance with exemplary embodiments. FIG. 1 illustrates a perspective view of substrate 20. In some embodiments, substrate 20 comprises bulk silicon. Alternatively, substrate 20 comprises bulk silicon germanium (SiGe) or other semiconductor materials. Substrate 20 may be doped with a p-type or an n-type impurity to form a well region, wherein the conductivity type of the well region depends on the types of the resulting FinFET and ESD device.

Shallow Trench Isolation (STI) regions 22 are formed in substrate 20. In some embodiments, STI regions 22 are formed by etching substrate 20 to form recesses, and then filling the recesses with dielectric materials, such as high-density plasma (HDP) oxides, TetraEthyl OrthoSilicate (TEOS) oxides, or the like. A Chemical Mechanical Polish (CMP) is performed to remove excess portions of the dielectric materials, and the remaining portions are STI regions. The portions of substrate 20 between STI regions 22 are referred to as semiconductor strips 24 hereinafter. Next, STI regions 22 are recessed, so that the top surfaces of STI regions 22 are lower than the top surfaces of semiconductor strips 24. The portions of semiconductor strips 24 that are higher than the top surfaces of STI regions 22 thus form semiconductor fins 26.

Figure 2:
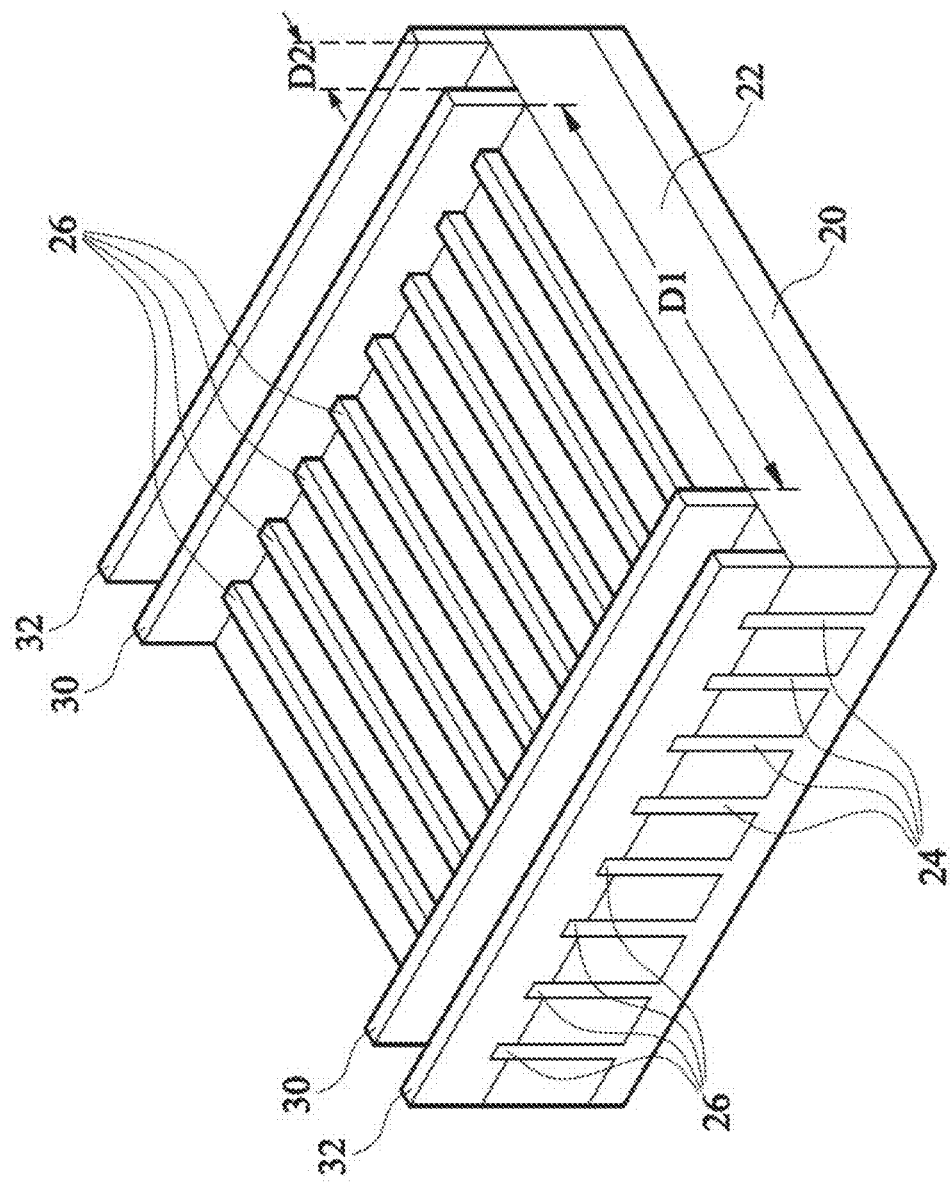

FIG. 2 illustrates the formation of gate stacks 30 and 32, which are parallel to each other. Each of gate stacks 30 and 32 are formed on the sidewalls and the top surfaces of a plurality of semiconductor fins 26. Each of gate stacks 30 and 32 includes gate dielectric 34 and gate electrode 35 (not shown in FIG. 2, please refer to FIG. 4B). Gate dielectrics 34 may include commonly used dielectric materials such as oxides, nitrides, oxynitrides, high-K dielectrics such as $Ta_2O_5$, $Al_2O_3$, HfO, $Ta_2O_5$, $SiTiO_3$, HfSiO, HfSiON, ZrSiON, and combinations thereof. Gate electrodes 35 may be formed of polysilicon in accordance with some embodiments. Alternatively, gate electrodes 35 may be formed of other commonly used conductive materials, including metals such as Ni, Ti, Ta, Hf, and combinations thereof, metal silicides such as NiSi, MoSi, HfSi, and combinations thereof, and metal nitrides such as TiN, TaN, HfN, HfAlN, MoN, NiAlN, and combinations thereof.

Referring again to FIG. 2, distance D1 between gate stacks 30 is greater than distance D2, which is the distance from one of gate stack 30 to its neighboring gate stack 32. The ratio D1/D2 may be greater than about 7 in some exemplary embodiments. Distance D1 may also be greater than about 1 µm in some embodiments. It is realized that the dimensions recited throughout the description are merely examples, and may be changed to different values.

Figure 3:
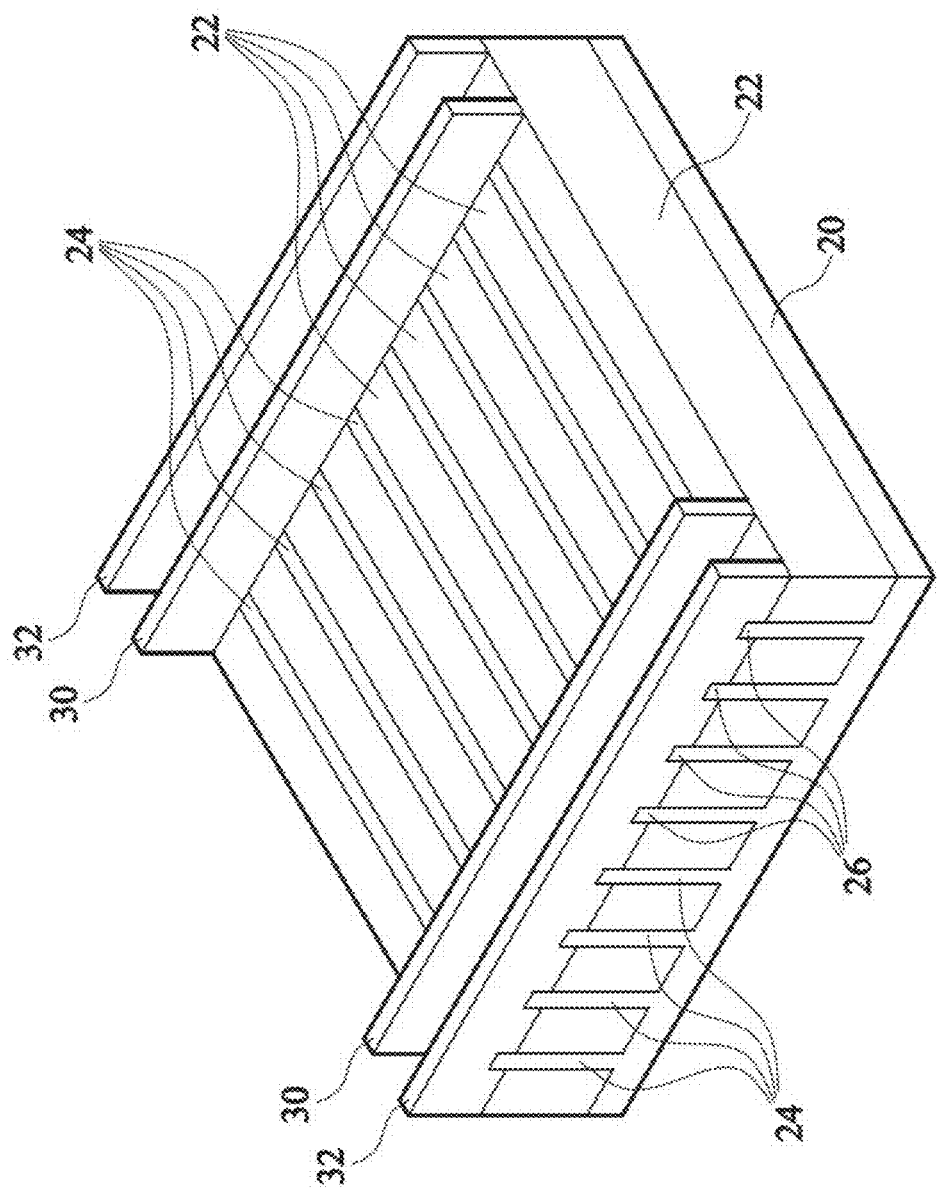

Referring to FIG. 3, the portions of semiconductor fins 26 that are not covered by gate stacks 30 and 32 are etched. The portions of semiconductor fins 26 that are covered by gate stacks 30 and 32 are protected, and are substantially not etched. In some embodiments, substantially entireties of the uncovered portions of semiconductor fins 26 are removed, while semiconductor strips 24 are not etched. In alternative embodiments, the top portions of uncovered portions of semiconductor fins 26 are etched, and the bottom portions of the uncovered portions of semiconductor fins 26 are not etched. In yet alternative embodiments, semiconductor fins 26 are not etched, and the subsequently performed epitaxy are performed on the un-etched semiconductor fins 26.

Figure 4A:
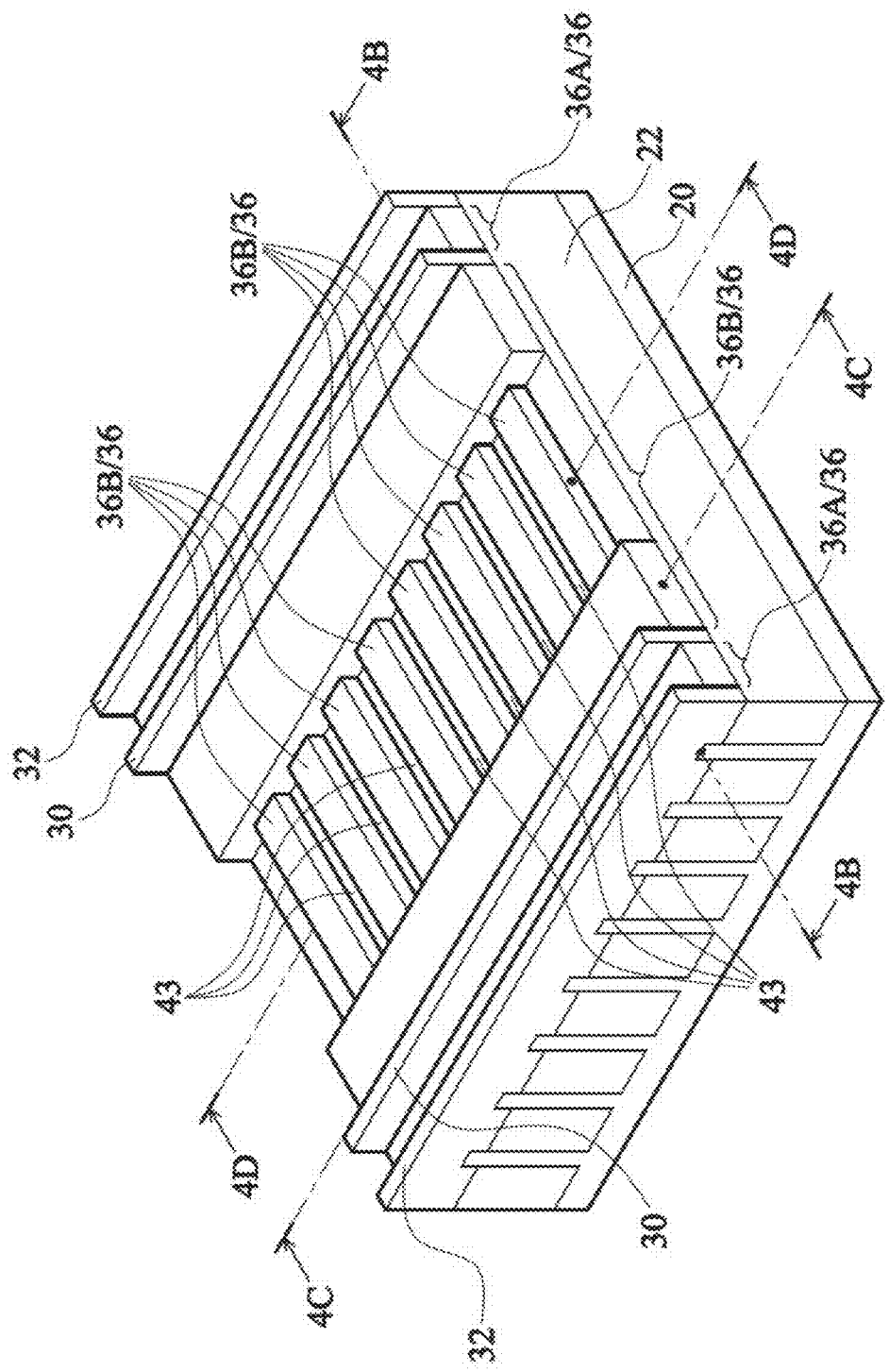

Next, as shown in FIGS. 4A through 4D, a selective epitaxial growth is performed to form epitaxy semiconductor material 36, which are grown from the exposed surfaces of semiconductor fins 26 or semiconductor strips 24. FIG. 4A illustrates a perspective view of the resulting structure. Throughout the description, the portions of semiconductor material 36 between each of gate stacks 30 and it neighboring gate stack 32 are referred to as source epitaxy region 36A. The portion of semiconductor material 36 between gate stacks 30 is referred to as drain epitaxy region 36B. In some embodiments, semiconductor material 36 is formed of the same material as that of substrate 20. In alternative embodiments, semiconductor material 36 is formed of a material different from that of substrate 20. For example, in the embodiments the resulting FinFET is a p-type FinFET, semiconductor material 36 may include silicon germanium (SiGe). Alternatively, in the embodiments the resulting FinFET is an n-type FinFET, semiconductor material 36 may include silicon carbon (SiC).

Figure 4B:
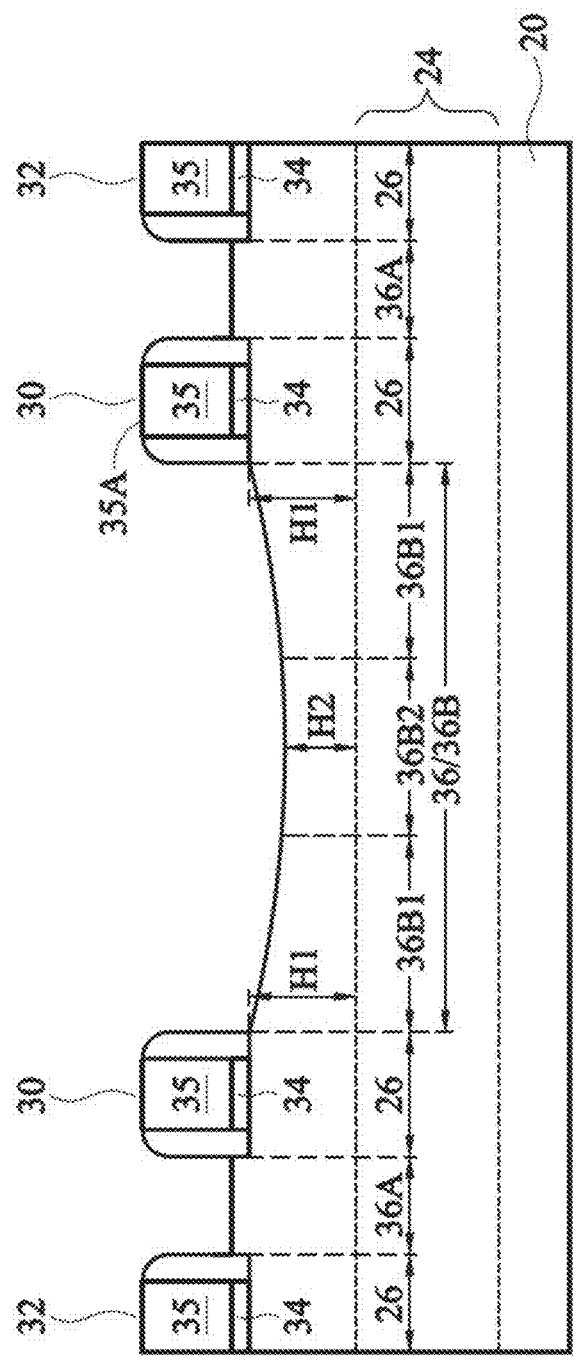

Since distance D1 has a large value, and the chip area occupied by the illustrated device region between gate stacks 30 is relatively large, there is a noticeable difference between the growth rates of different portions of drain epitaxy region 36B. FIG. 4B illustrates a cross-sectional view obtained from the plane crossing line 4B-4B in FIG. 4A. It is noted that although FIG. 4A illustrates that the top surfaces of epitaxy regions 36B have steps, in actual profile, the heights of the top surfaces of epitaxy regions 36B change gradually, as shown in FIG. 4B. Drain epitaxy region 36B may have a top surface having a dishing profile, with the middle portion (which is close to the middle of gate stacks 30) being lower than portions close to gate stacks 30. Alternatively stated, in the cross-sectional view in FIG. 4B, first portions 36B1 of drain epitaxy region 36B have height H1, which is greater than the height H2 of second portion 36B2 of drain epitaxy region 36B. First portions 36B1 are adjacent to gate stacks 30, and second portion 36B2 is at the middle between gate stacks 30. From gate stacks 30 to the middle point between gate stacks 30, the top surfaces of epitaxy regions 36B are gradually and continuously lowered.

Figure 4C:
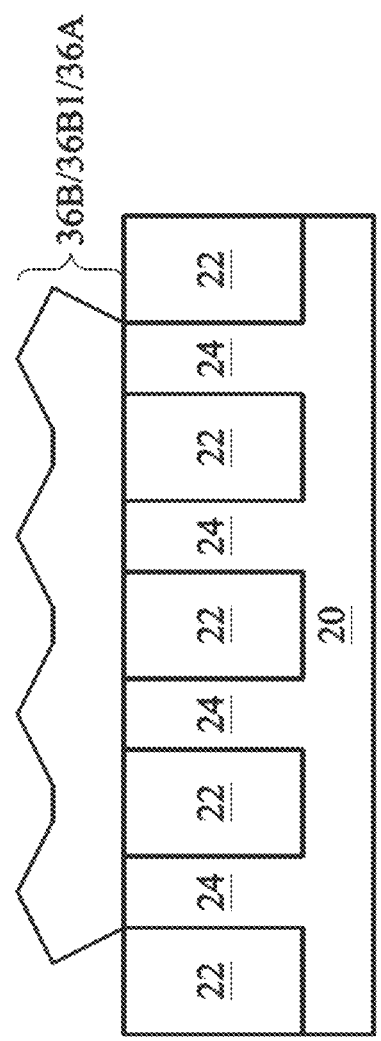
Figure 4D:
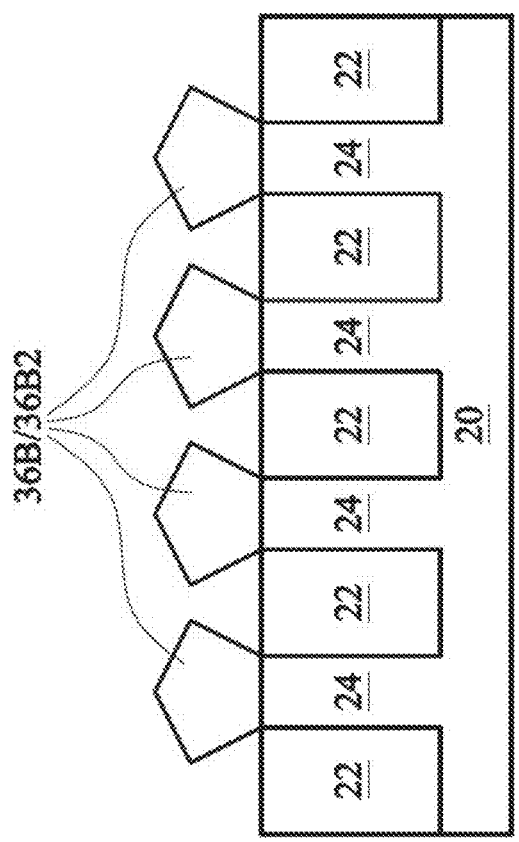

FIGS. 4C and 4D are cross-sectional views of the structure shown in FIG. 4A, wherein the cross-sectional views are obtained from the planes crossing lines 4C-4C and 4D-4D, respectively, in FIG. 4A. Referring to FIG. 4C, since the epitaxial growth includes vertical growth and horizontal growth, the portion of drain epitaxy region 36B grown from each of semiconductor fins/strips 24/26 eventually merges with the portions of drain epitaxy regions 36B grown from neighboring fins/strips 24/26. The merge occurs at the regions (for example, 36B1) close to gate stacks 30. Furthermore, the portions of source epitaxy region 36A grown from one of semiconductor fins/strips 24/26 merge with the portion of epitaxy region 36B grown from a neighboring fin/strip 24/26. The respective profile of source epitaxy region 36A is also similar to what is shown in FIG. 4C.

Referring to FIG. 4D, in the regions (for example, 36B2) close to the middle of gate stacks 30, the growth is slower, and drain epitaxy region 36B form individual strips in portion 36B2 that do not merge with each other.

Figure 5A:
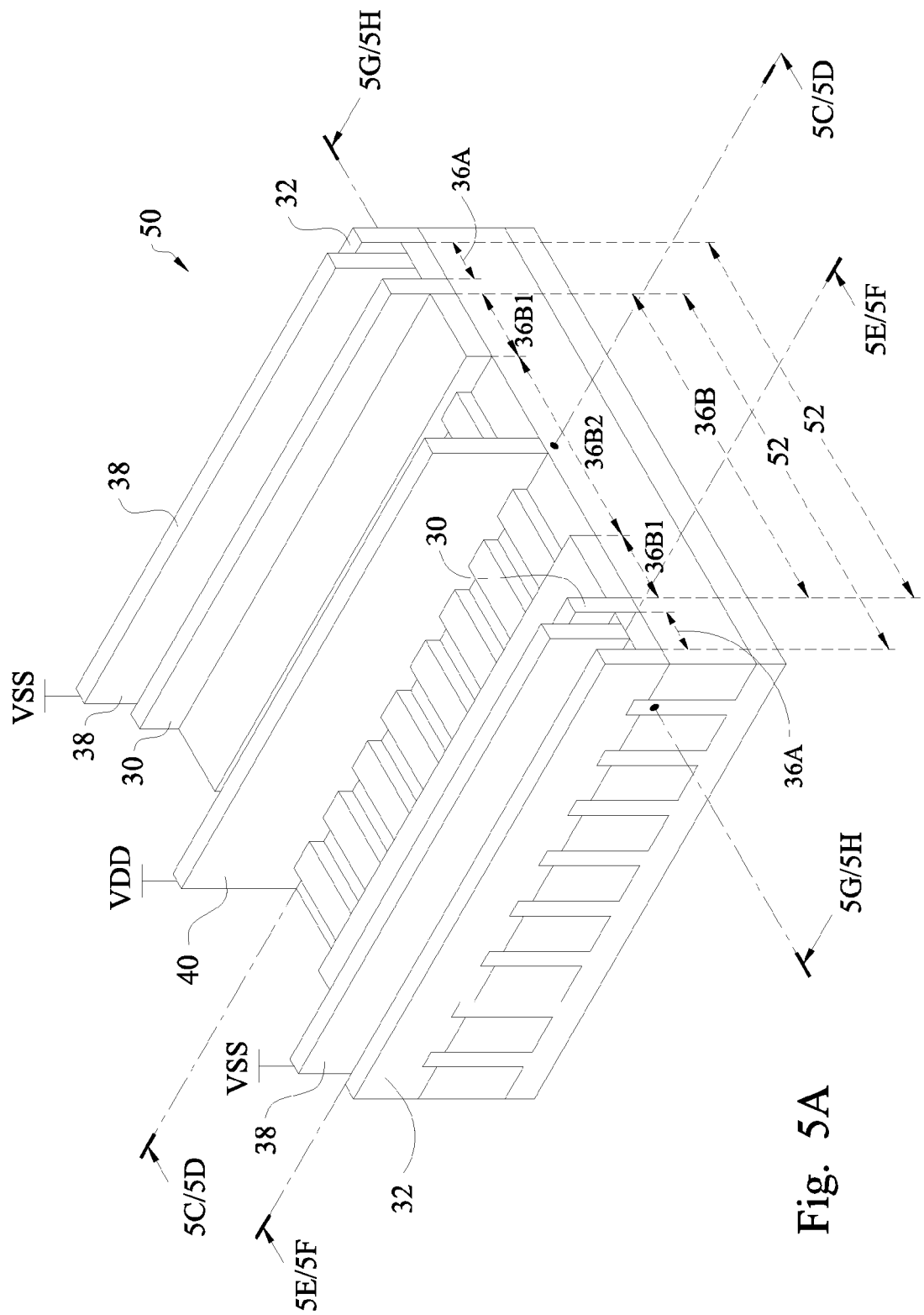

FIGS. 5A through 5H illustrate a perspective view, a top view, and cross-sectional views illustrating the formation of source contact plugs 38 and drain contact plug 40, and the underlying silicide regions 42 (not shown in FIG. 5A, please refer to FIGS. 5C through 5H). Referring to FIG. 5A, source contact plugs 38 are formed over, and electrically coupled to, the respective underlying source epitaxy regions 36A. Drain contact plug 40 is formed over, and electrically coupled to, drain epitaxy regions 36B. Source contact plugs 38 and drain contact plug 40 may form strips that have lengthwise directions parallel to the lengthwise directions of gate stacks 30 and 32.

Figure 5B:
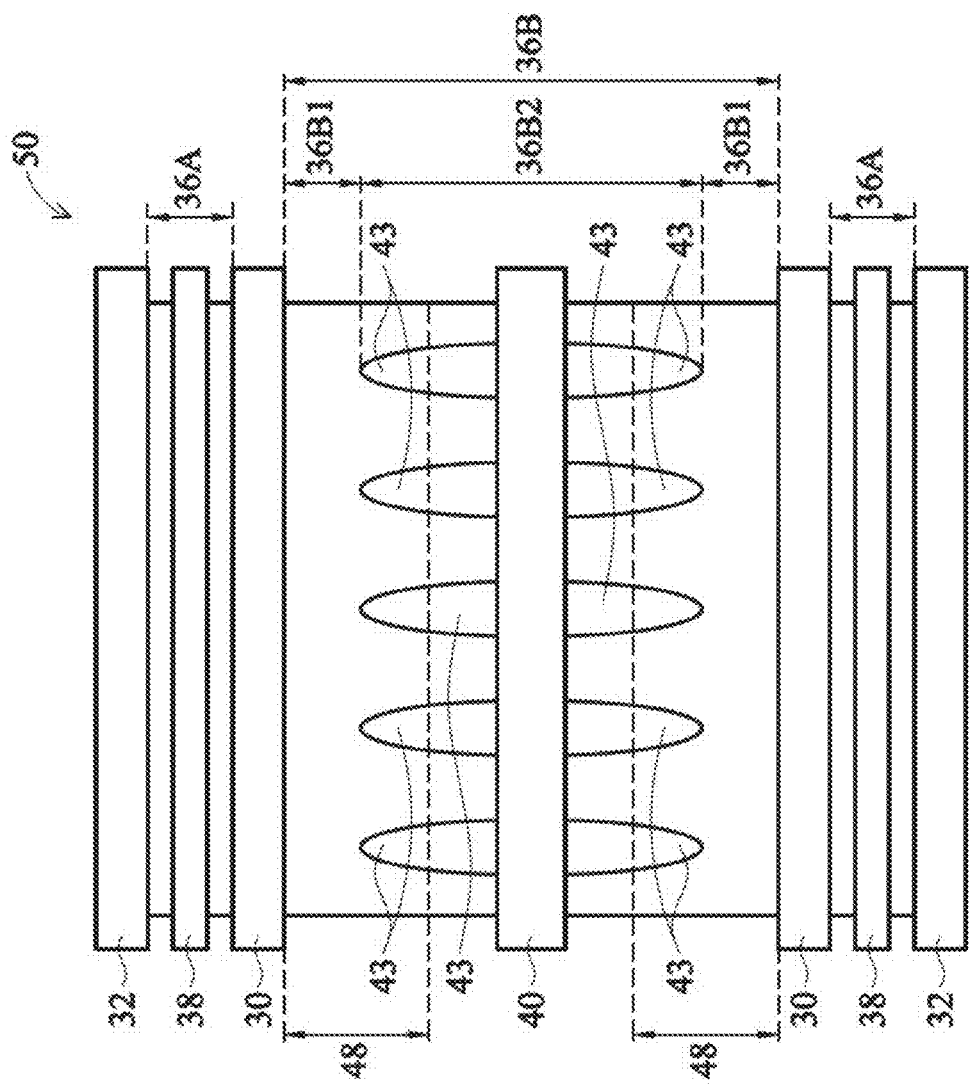

FIG. 5B illustrates a top view of the structure shown in FIG. 5A. In the top view, drain epitaxy region 36B2 includes a plurality of voids 43 therein. Voids 43 separate the portions 36B2 of epitaxy material 36 that grown from different semiconductor fins/strips 24/26 from each other. Some portions of voids 43 are filled with drain contact plug 40, and the remaining portions of voids 43 are filled with a dielectric material(s) in subsequent steps. Furthermore, drain contact plug 40 crosses the un-merged portions 36B2 of drain epitaxy region 36B. In some embodiments, drain contact plug 40 does not overlap the merged portions 36B1 of drain epitaxy region 36B. Voids 43 may extend to the opposite sides of drain contact plug 40.

Figure 5C:
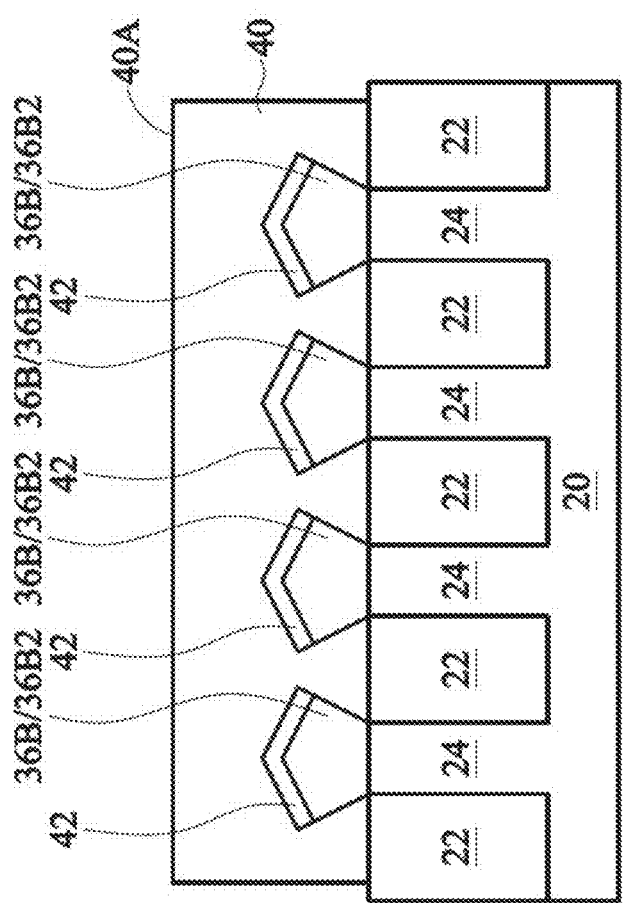
Figure 5D:
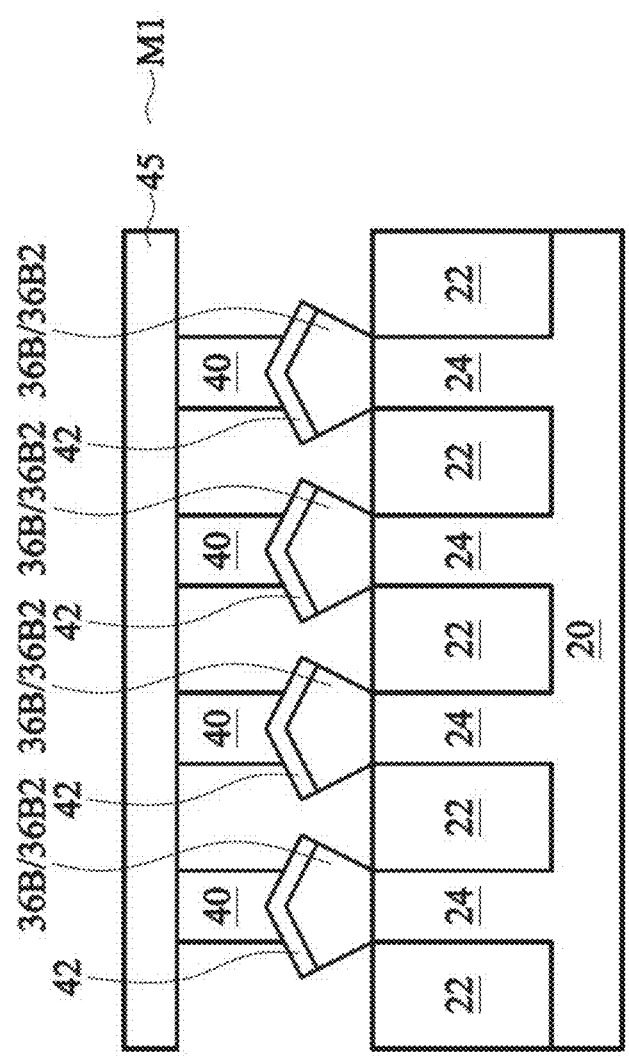

FIG. 5C illustrates a cross-sectional view of the structure shown in FIG. 5A, wherein the cross-sectional view is obtained from the plane crossing line 5C/5D-5C/5D in FIG. 5A. Silicide regions 42 are formed on the top surfaces of drain epitaxy region 36B. In some embodiments, drain contact plug 40 has top surface 40A substantially level with the top surface 35A of gate electrodes 35 (FIG. 4B). The respective drain contact plug 40 may sometimes be referred to as M0OD. In alternative embodiments, as shown in FIG. 5D, there may be a plurality of drain contact plugs 40, whose top surfaces are in contact with the bottom surface of metal line 45. Metal line 45 may be in bottom metal layer M1.

Figure 5E:
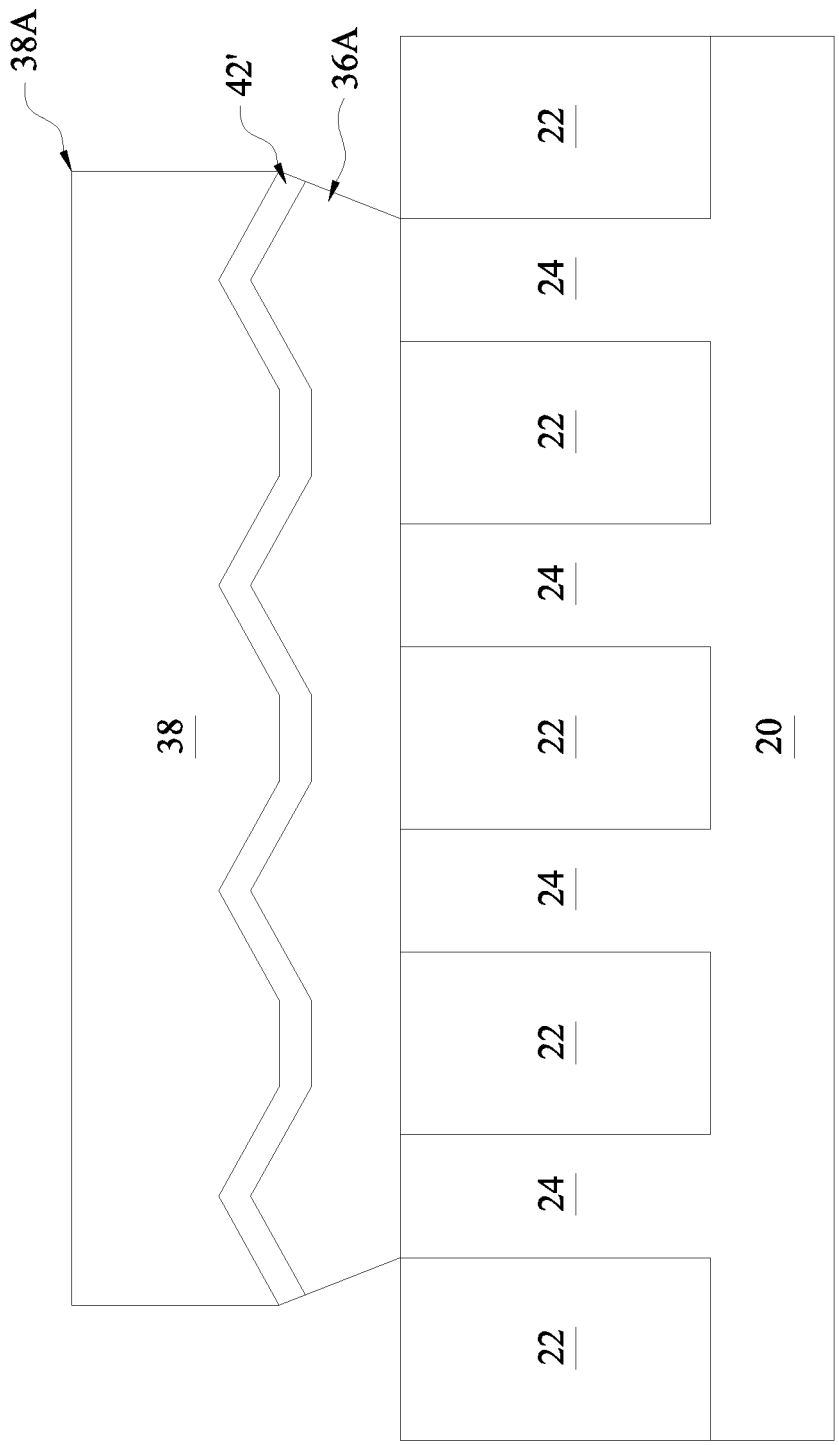
Figure 5F:
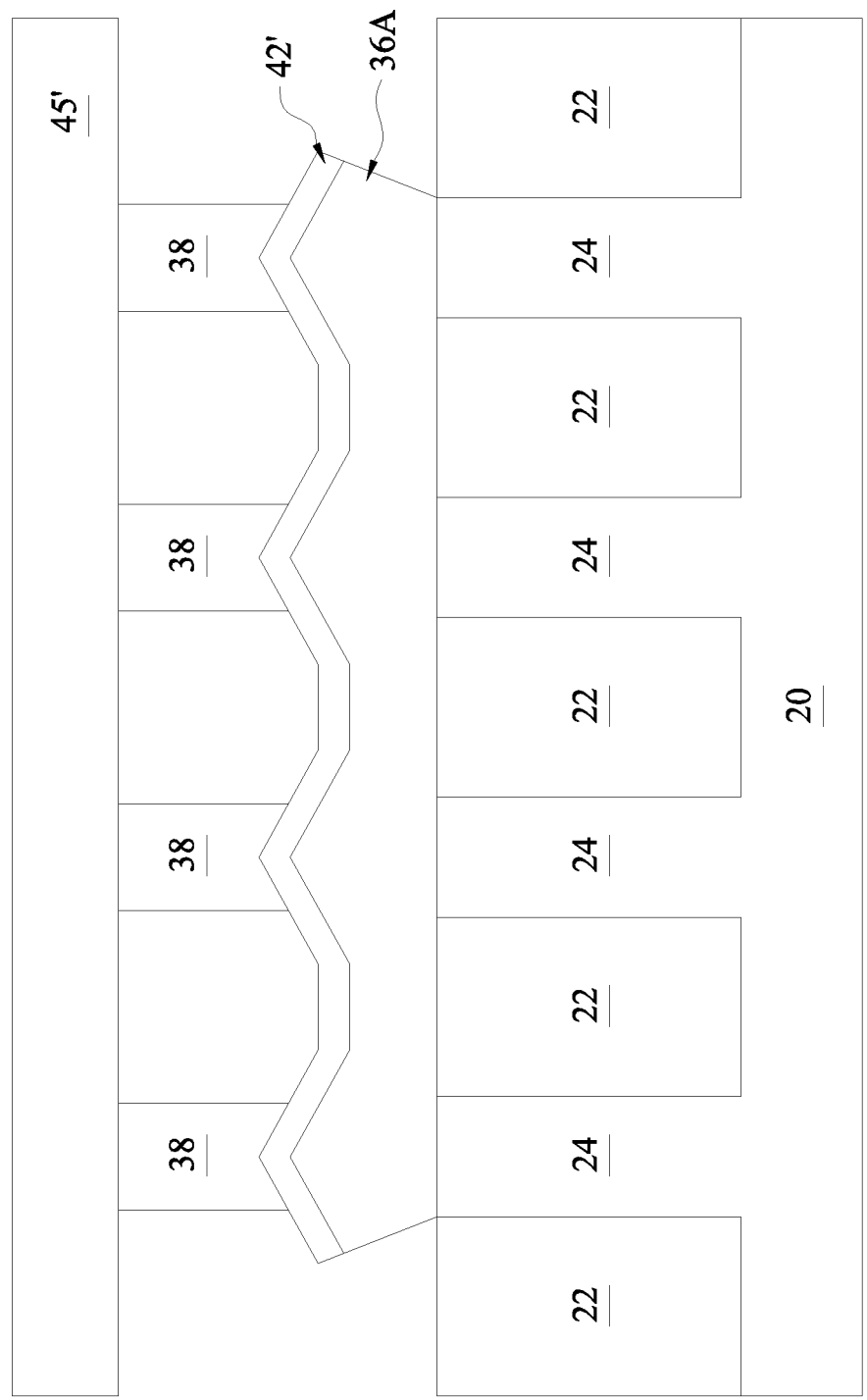

FIG. 5E illustrates a cross-sectional view of the structure shown in FIG. 5A, wherein the cross-sectional view is obtained from the plane crossing line 5E/5F-5E/5F in FIG. 5A. Source silicide regions 42' are formed on the top surfaces of source epitaxy region 36A. In some embodiments, source contact plug 38 has top surface 38A substantially level with the top surface 35A of gate electrodes 35 (FIG. 4B). The respective source contact plug 38 may sometimes be referred to as M0OD. In alternative embodiments, as shown in FIG. 5F, there may be a plurality of source contact plugs 38, whose top surfaces are in contact with the bottom surface of metal line 45'. Metal line 45' may be in bottom metal layer M1.

Figure 5G:
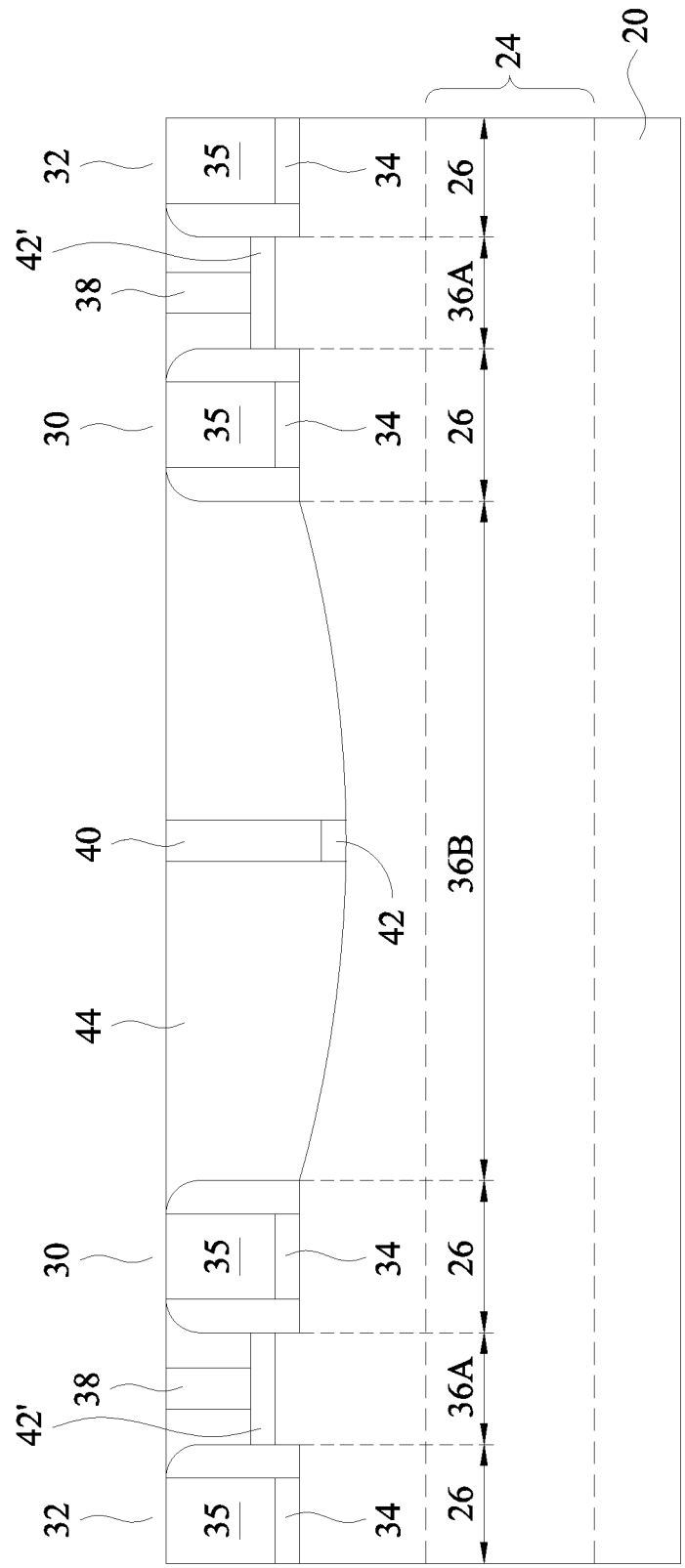
Figure 5H:
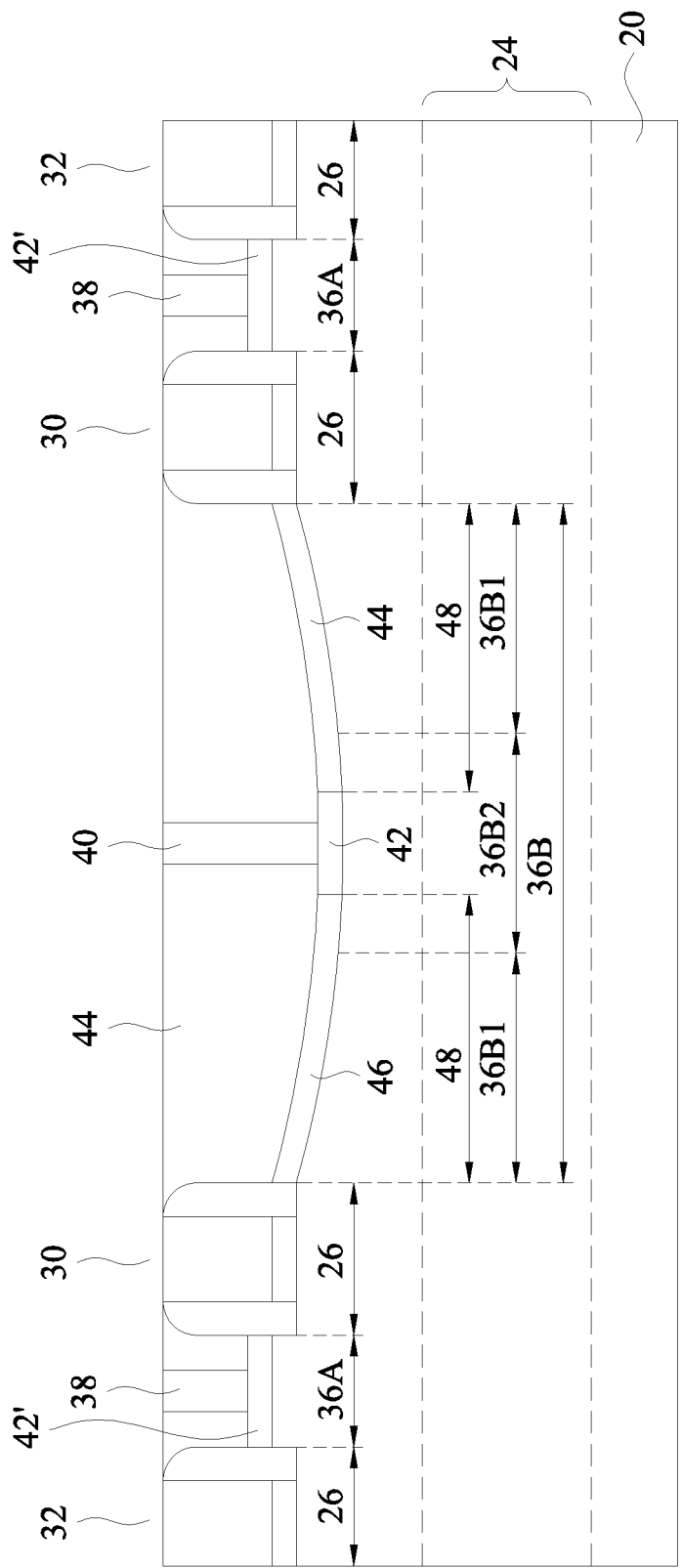

FIGS. 5G and 5H illustrate cross-sectional views of the structure shown in FIG. 5A, wherein the cross-sectional views are obtained from the plane crossing line 5G/5H-5G/5H in FIG. 5A. In some embodiments, as shown in FIG. 5G, the silicide-last approach is used to form drain silicide region 42. In the silicide-last approach, dielectric layer 44 is formed first. Drain silicide region 42 is formed by forming an opening in dielectric layer 44 to expose some portions of drain epitaxy region 36B, and performing a self-aligned silicidation on the exposed portions of drain epitaxy region 36B. Accordingly, drain silicide region 42 has edges aligned to the respective edges of drain contact plug 40. The other portions of drain epitaxy region 36B, however, may not have silicide regions formed thereon. This may help to increase the drain resistance, and the ESD devices in accordance with the embodiments may be turned on more uniformly.

In FIG. 5H, the silicide-first approach is used to form drain silicide region 42. In the silicide-first approach, Resistive Protective Oxide (RPO) 46 is formed, wherein RPO 46 at least covers some portions of unmerged drain epitaxy region 36B2. FIGS. 5B and 5H schematically illustrate regions 48, in which RPO is formed. As shown in FIG. 5H again, after the formation of RPO 46, drain silicide region 42 is formed where no RPO 46 is formed. In these embodiments, drain silicide region 42 may extend slightly beyond the respective edges of drain contact plug 40. In both FIGS. 5G and 5H, source silicide regions 42' are also formed at the same time drain silicide region 42 is formed. Source silicide regions 42' may be formed on entireties of source epitaxy regions 36A.

Referring back to FIG. 5A, the structure shown in FIGS. 5A through 5H form ESD device 50, which includes two FinFETs 52 that share a common drain region 36B. Each of FinFETs 52 further includes source epitaxy regions 36A. In some embodiments, drain contact plug 40 is connected to an input/output (I/O) pad or power supply node VDD, and source contact plugs 38 are connected to power supply node VSS, which may be the electrical ground. In alternative embodiments, when FinFETs 52 are n-type FinFETs, drain contact plug 40 may be connected to an output pad of a circuit, source contact plugs 38 may be connected to power supply node VSS, and gate electrodes 35 (FIG. 4B) of gate stacks 30 may be connected to the internal circuit or VSS. Conversely, when FinFETs 52 are p-type FinFETs, drain contact plug 40 may be connected to an output pad of a circuit, source contact plugs 38 may be connected to power supply node VDD, and gate electrodes 35 of gate stacks 30 may be connected to the internal circuit or VDD. The electrodes 35 of gate stacks 32 may be electrically floating.

FIGS. 6A through 6H illustrate various embodiments of metal layers that electrically couple the source and drain epitaxy regions 36A and 36B. FIGS. 6A through 6D illustrate cross-sectional views obtained from the plane crossing line 5C/5D-5C/5D in FIG. 5A, for example, after further processing, such as the formation of one or more metal layer. FIGS. 6E through 6H illustrate cross-sectional views obtained from the plane crossing line 5E/5F-5E/5F in FIG. 5A, for example, after further processing, such as the formation of one or more metal layer.

Figure 6A:
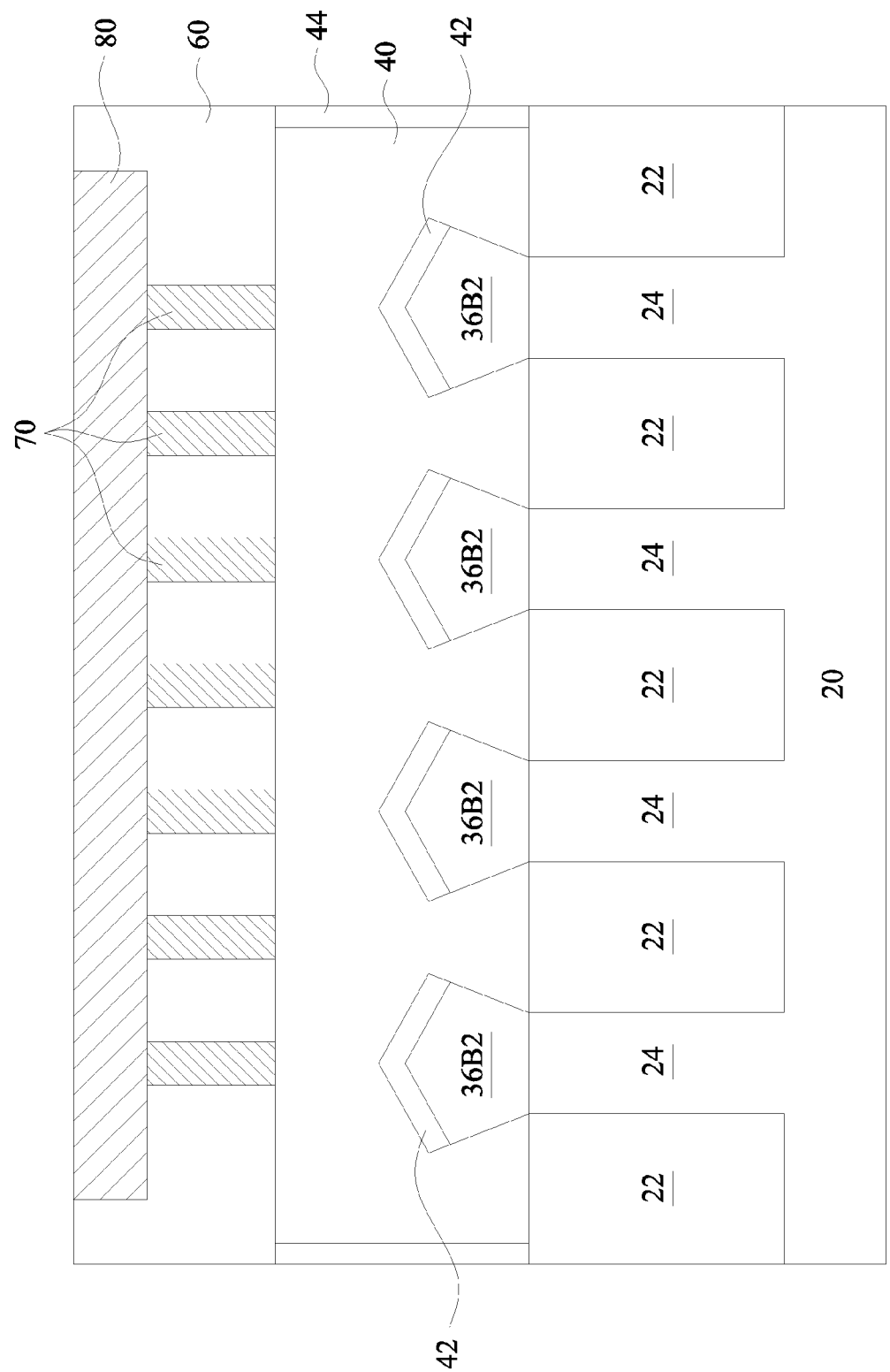
FIGS. 6A through 6H are cross-sectional views of various metal layers and vias that electrically coupled source and drain epitaxy regions of the ESD device in accordance with some exemplary embodiments.

Referring to FIG. 6A, a metal line 80 with vias 70 in a dielectric layer 60 are formed on the structure of FIG. 5C. As previously discussed, the drain contact plug 40 is formed in the dielectric layer 44 and is over, and electrically coupled to, the drain epitaxy regions 36B2. The dielectric layer 44 may be an inter-layer dielectric (ILD). The dielectric layer 60 may be a bottom inter-metallization dielectric (IMD1) and is formed over the dielectric layer 44 and the drain contact plug 40. The metal line 80 in the dielectric layer 60 may be in a bottom metal layer M1. The vias 70 extend from the metal line 80 in the dielectric layer 60 through the dielectric layer 60 to the drain contact plug 40.

The dielectric layer 60 may be formed, for example, of a low-K dielectric material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), plasma-enhanced CVD (PECVD), or the like. It should also be noted that the dielectric layer 60 may comprise any number of dielectric layers, which may include an etch stop layer.

A damascene process may be used to form the metal line 80 and vias 70 in the dielectric layer 60. For example, a photolithography process(es) employing one or more photoresist may be used to etch recesses and openings where the metal line 80 and vias 70 will be formed. The etching may use any acceptable etch process, such as a dry anisotropic etch. A conductive material is then deposited in the recesses and openings. The conductive material may include a liner, such as a diffusion barrier, adhesion layer, or the like, which may include titanium, titanium nitride, tantalum, tantalum nitride, or the like deposited by atomic layer deposition (ALD), or the like. The recesses and openings may then be filled with copper, a copper alloy, silver, gold, tungsten, aluminum, or the like, deposited by plating, physical vapor deposition (PVD), ALD, or the like. Any excess conductive material may be removed, for example, by a CMP.

Figure 6B:
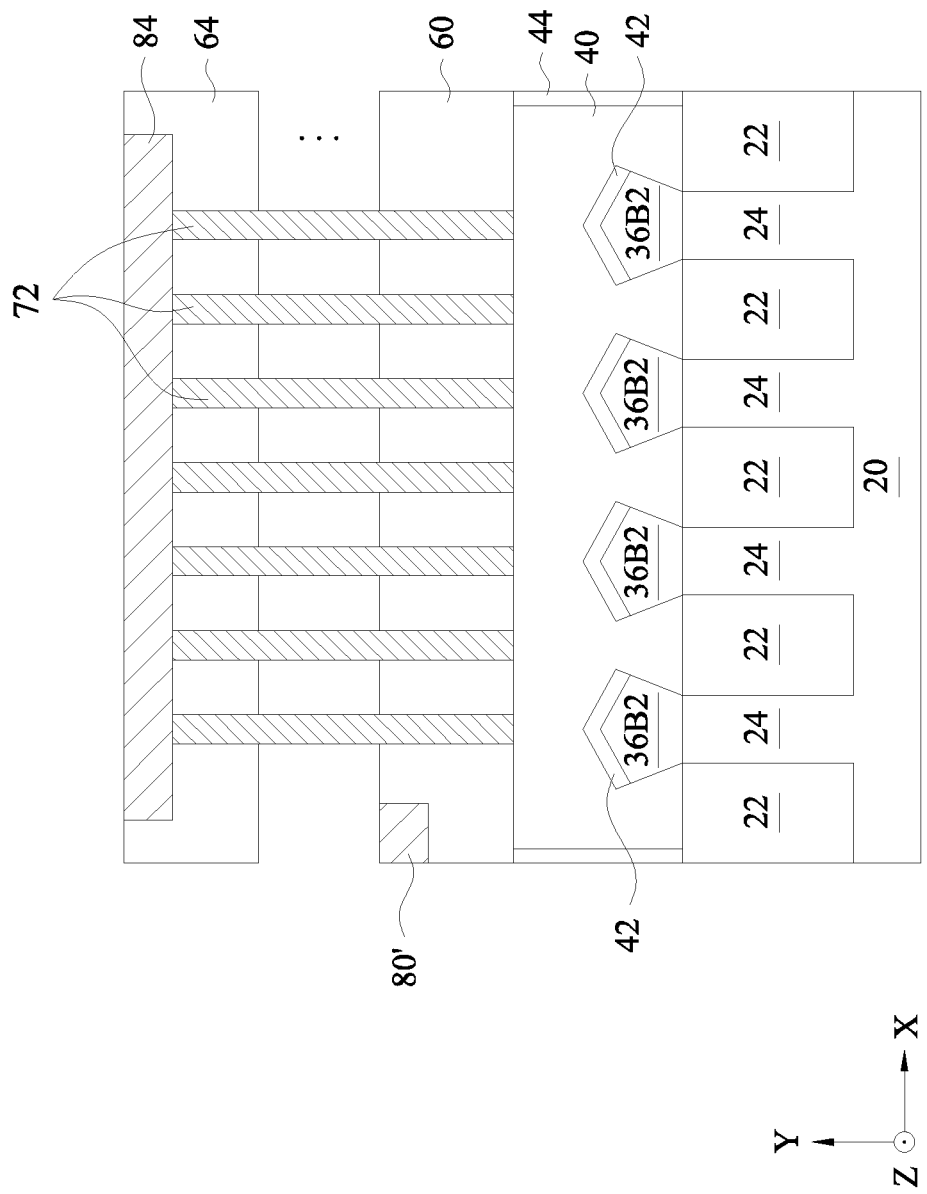

Referring to FIG. 6B, a dielectric layer 60 and a metal line 80' therein are formed on the structure of FIG. 5C; a dielectric layer 64 and a metal line 84 therein are formed over the dielectric layer 60, and vias 72 extending from the metal line 84 through dielectric layers 60 and 64 to the drain contact plug 40 are formed. As previously discussed, the drain contact plug 40 is formed in the dielectric layer 44 and is over, and electrically coupled to, the drain epitaxy regions 36B. The dielectric layer 44 may be an ILD. The dielectric layer 60 may be an IMD1 and is formed over the dielectric layer 44 and the drain contact plug 40. The metal line 80' in the dielectric layer 60 may be in a bottom metal layer M1. The dielectric layer 64 is formed over the dielectric layer 60. The dielectric layer 64 may adjoin dielectric layer 60 (e.g., no dielectric layer having a metallization disposed between) or one or more dielectric layer having a metallization may be disposed between the dielectric layers 60 and 64. Hence, the dielectric layer 64 may be referred to as an upper IMD (IMDX). The metal line 84 in the dielectric layer 64 may be in an upper metal layer MX. The vias 72 extend continuously from the metal line 84 in the dielectric layer 64 through the dielectric layers 64 and 60 and any intervening dielectric layers to the drain contact plug 40.

The dielectric layer 60 and metal line 80' may be formed as similarly as discussed above with respect to FIG. 6A. The metal line 80' has a width in a Z direction and a thickness in a Y direction. The width may be in a plane of a top surface of the dielectric layer 60 and perpendicular to a longitudinal axis of the metal line 80'. The thickness may be in a direction perpendicular to the top surface of the dielectric layer 60. In FIG. 6B, no vias are formed from the metal line 80' to the drain contact plug 40. Further, vias may extend from the metal line 80' to different features on the substrate 20. Each of these vias may have a width in an X and/or Z direction. The widths of the vias may be in a direction parallel to the top surface of the dielectric layer 60 and parallel or perpendicular to the longitudinal axis of the metal line 80'. The metal line 80' may be located anywhere in the structure, and the position of metal line 80' in FIG. 6B is for illustrative purposes only.

The dielectric layer 64 may be formed, for example, of a low-K dielectric material, such as PSG, BPSG, FSG, SiOxCy, Spin-On-Glass, Spin-On-Polymers, silicon carbon material, compounds thereof, composites thereof, combinations thereof, or the like, by any suitable method, such as spinning, CVD, PECVD, or the like. It should also be noted that the dielectric layer 64 may comprise any number of dielectric layers, which may include an etch stop layer.

A damascene process may be used to form the metal line 84 in the dielectric layer 60 and vias 72 through the dielectric layers 60 and 64 and any intervening dielectric layers. As an example, a photolithography process(es) employing one or more photoresist may be used to etch recesses and openings through the dielectric layers where the metal line 84 and vias 72 will be formed. The etching may use any acceptable etch process, such as a dry anisotropic etch. Openings for the vias 72 may have a high aspect ratio since the openings may extend through multiple dielectric layers. A conductive material is then deposited in the recesses and openings. The conductive material may include a liner, such as a diffusion barrier, adhesion layer, or the like, which may include titanium, titanium nitride, tantalum, tantalum nitride, or the like deposited by ALD or the like. The recesses and openings may then be filled with copper, a copper alloy, silver, gold, tungsten, aluminum, or the like, deposited by plating, PVD, ALD, or the like. Any excess conductive material may be removed, for example, by a CMP.

The metal line 84 has a width in a Z direction and a thickness in a Y direction. The width may be in a plane of a top surface of the dielectric layer 64 and perpendicular to a longitudinal axis of the metal line 84. The thickness may be in a direction perpendicular to the top surface of the dielectric layer 64. The vias 72 may have a width in an X and/or Z direction. The widths of the vias 72 may be in a direction parallel to the top surface of the dielectric layer 64 and parallel or perpendicular to the longitudinal axis of the metal line 84. By using vias 72 directly coupled between the drain contact plug 40 and an upper metal layer MX (e.g., the metal line 84), larger dimensions of the vias 72, such as width, and larger dimensions of the metal line 84, such as width and/or thickness, may be employed compared to dimensions of vias extending from a bottom metal layer M1 (e.g., metal line 80') to the substrate 20 and dimensions of the metal line 80', respectively. More particularly, a width and/or thickness of the metal line 84 may be greater than a width and/or thickness, respectively, of the metal line 80', and a width of vias 72 may be greater than a width of vias extending between the metal line 80' and the substrate 20. By allowing for larger dimensions, adverse effects of high currents through the conductive features, such as electromigration, may be reduced.

Figure 6C:
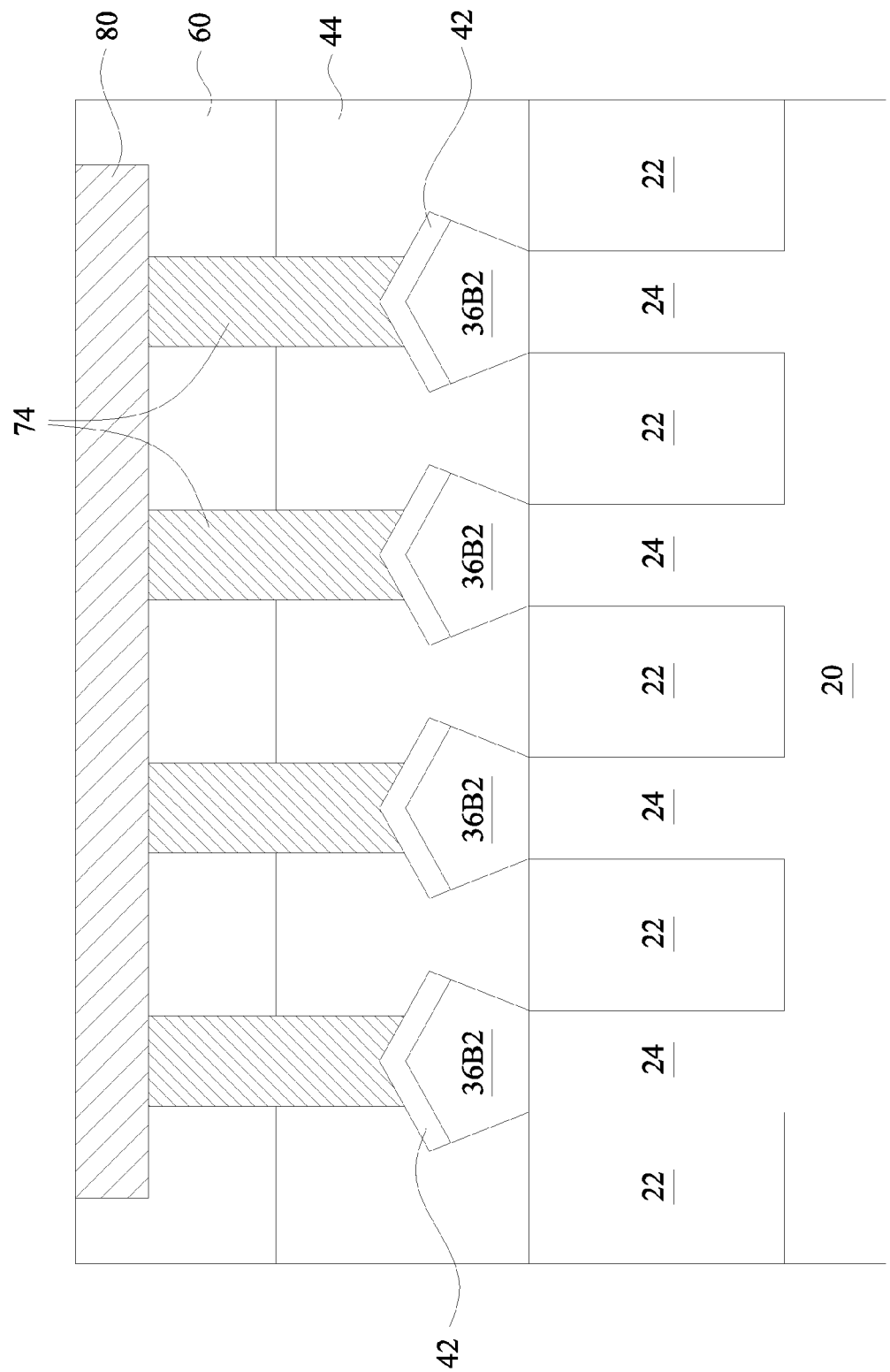

Referring to FIG. 6C, a dielectric layer 60 and a metal line 80 therein are formed on the structure of FIG. 5D, and vias 74 extending continuously through the dielectric layers 60 and 44 to the drain silicide regions 42 and/or the drain epitaxy regions 36B2 are formed. The dielectric layer 44 may be an ILD. The dielectric layer 60 may be an IMD1 and is formed over the dielectric layer 44. The metal line 80 in the dielectric layer 60 may be in a bottom metal layer M1. The vias 74 extend from the metal line 80 in the dielectric layer 60 through the dielectric layers 60 and 44 to the drain epitaxy regions 36B2. The dielectric layer 60, metal line 80, and vias 74 may be formed similarly as discussed with respect to FIG. 6A.

Figure 6D:
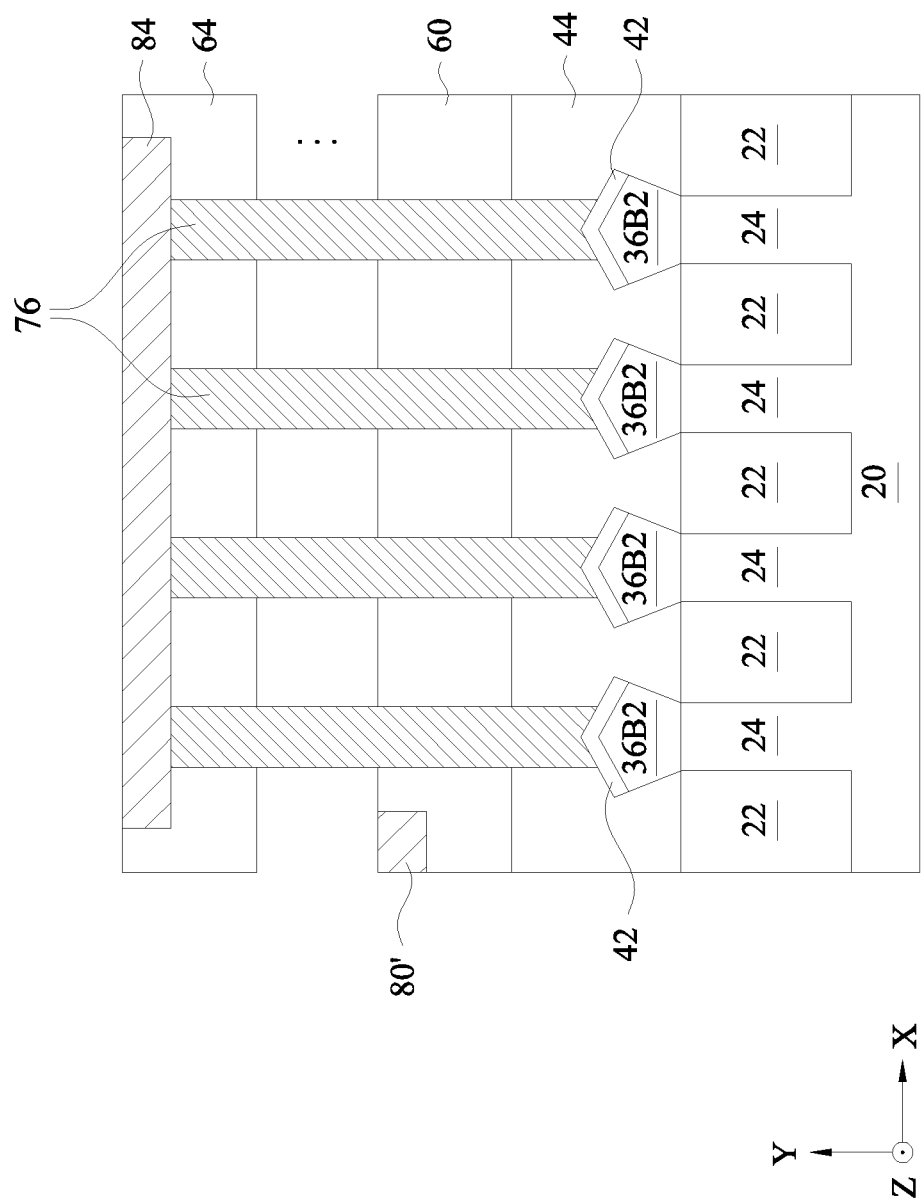

Referring to FIG. 6D, a dielectric layer 60 and a metal line 80' therein are formed on the structure of FIG. 5D; a dielectric layer 64 and a metal line 84 therein are formed over the dielectric layer 60, and vias 76 extending from the metal line 84 through dielectric layers 44, 60, and 64 to the drain silicide regions 42 and/or the drain epitaxy regions 36B2 are formed. The dielectric layer 44 may be an ILD. The dielectric layer 60 may be an IMD1 and is formed over the dielectric layer 44. The metal line 80' in the dielectric layer 60 may be in a bottom metal layer M1. The dielectric layer 64 is formed over the dielectric layer 60. The dielectric layer 64 may adjoin dielectric layer 60 (e.g., no dielectric layer having a metallization disposed between) or one or more dielectric layer having a metallization may be disposed between the dielectric layers 60 and 64. Hence, the dielectric layer 64 may be referred to as an IMDX. The metal line 84 in the dielectric layer 64 may be in an upper metal layer MX. The vias 76 extend continuously from the metal line 84 in the dielectric layer 64 through the dielectric layers 64, 60, and 44 and any intervening dielectric layers to the drain silicide regions 42 and/or the drain epitaxy regions 36B2. The dielectric layers 60 and 64, metal lines 80' and 84, and vias 76 may be formed similarly as discussed with respect to FIG. 6B.

The metal line 80' has a width in a Z direction and a thickness in a Y direction. The width may be in a plane of a top surface of the dielectric layer 60 and perpendicular to a longitudinal axis of the metal line 80'. The thickness may be in a direction perpendicular to the top surface of the dielectric layer 60. As with FIG. 6B, in FIG. 6D, no vias are formed from the metal line 80' to the drain silicide regions 42 or the drain epitaxy regions 36B2. Further, vias may extend from the metal line 80' to different features on the substrate 20. Each of these vias may have a width in an X and/or Z direction. The widths of the vias may be in a direction parallel to the top surface of the dielectric layer 60 and parallel or perpendicular to the longitudinal axis of the metal line 80'. The metal line 80' may be located anywhere in the structure, and the position of metal line 80' in FIG. 6D is for illustrative purposes only.

The metal line 84 has a width in a Z direction and a thickness in a Y direction. The width may be in a plane of a top surface of the dielectric layer 64 and perpendicular to a longitudinal axis of the metal line 84. The thickness may be in a direction perpendicular to the top surface of the dielectric layer 64. The vias 76 may have a width in an X and/or Z direction. The widths of the vias 76 may be in a direction parallel to the top surface of the dielectric layer 64 and parallel or perpendicular to the longitudinal axis of the metal line 84. By using vias 76 directly coupled between the drain silicide regions 42 and/or the drain epitaxy regions 36B2 and an upper metal layer MX (e.g., the metal line 84), larger dimensions of the vias 76, such as a width, and larger dimensions of the metal line 84, such as width and/or thickness, may be employed compared to dimensions of vias extending from a bottom metal layer M1 (e.g., metal line 80') to the substrate 20 and dimensions of the metal line 80'. More particularly, a width and/or thickness of the metal line 84 may be greater than a width and/or thickness, respectively, of the metal line 80', and a width of vias 76 may be greater than a width of vias extending between the metal line 80' and the substrate 20. By allowing for larger dimensions, adverse effects of high currents through the conductive features, such as electromigration, may be reduced.

Figure 6E:
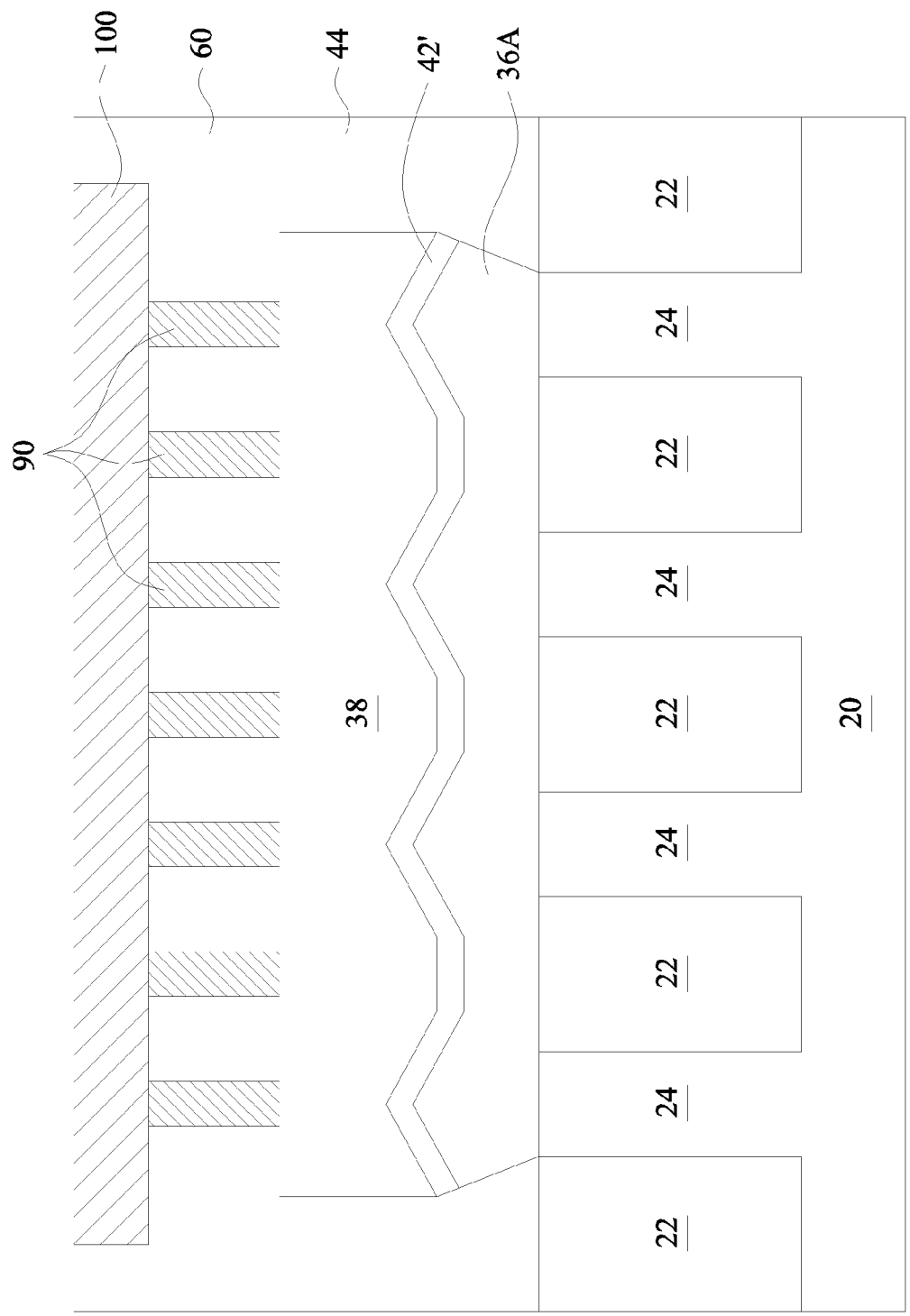

Referring to FIG. 6E, a metal line 100 with vias 90 in a dielectric layer 60 are formed on the structure of FIG. 5E. As previously discussed, the source contact plug 38 is formed in the dielectric layer 44 and is over, and electrically coupled to, the source epitaxy regions 36A. The dielectric layer 44 may be an ILD. The dielectric layer 60 may be an IMD1 and is formed over the dielectric layer 44 and the source contact plug 38. The metal line 100 in the dielectric layer 60 may be in a bottom metal layer M1. The vias 90 extend from the metal line 100 in the dielectric layer 60 through the dielectric layer 60 to the source contact plug 38. The dielectric layer 60, metal line 100, and vias 90 may be formed similarly as discussed with respect to FIG. 6A.

Figure 6F:
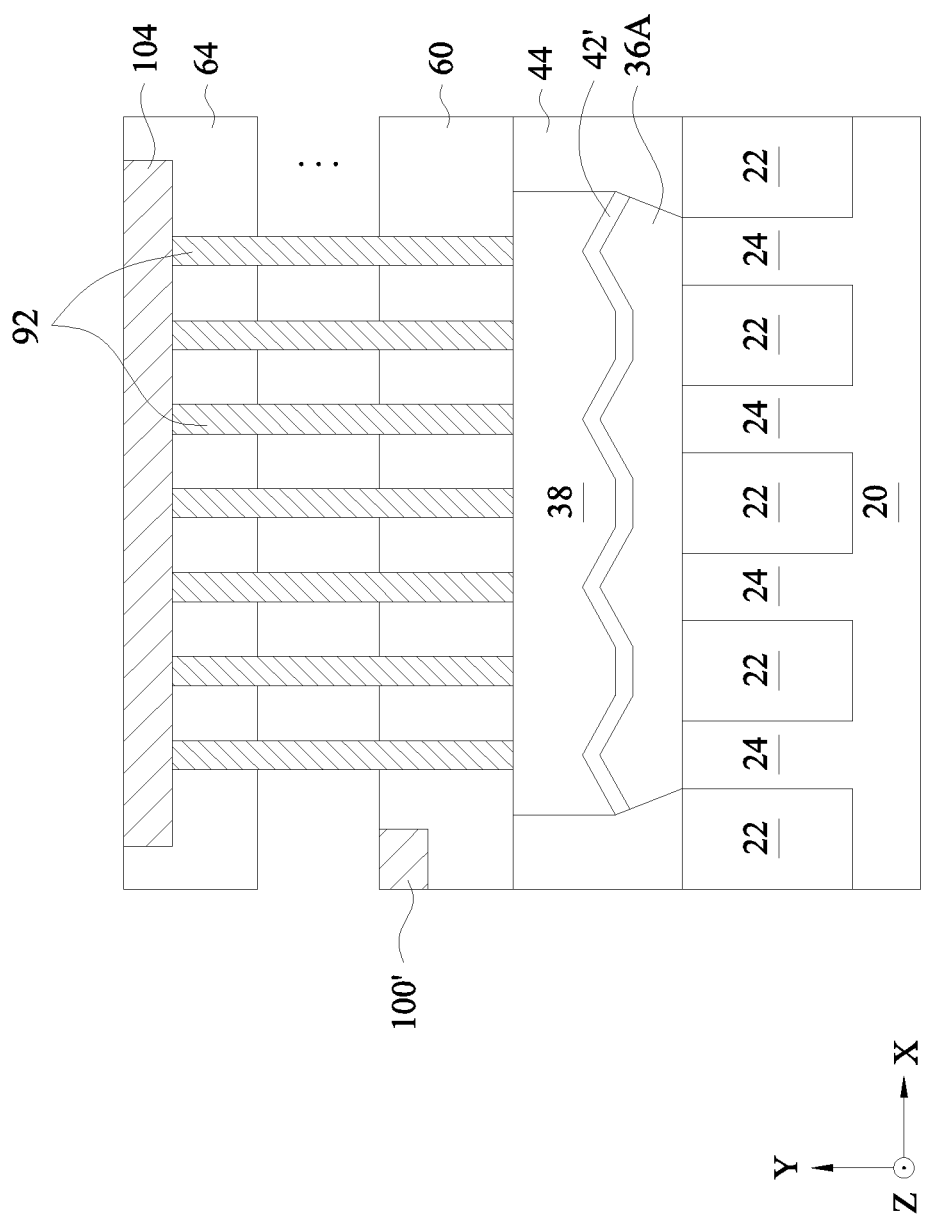

Referring to FIG. 6F, a dielectric layer 60 and a metal line 100' therein are formed on the structure of FIG. 5E; a dielectric layer 64 and a metal line 104 therein are formed over the dielectric layer 60, and vias 92 extending from the metal line 104 through dielectric layers 60 and 64 to the source contact plug 38 are formed. As previously discussed, the source contact plug 38 is formed in the dielectric layer 44 and is over, and electrically coupled to, the source epitaxy regions 36A. The dielectric layer 44 may be an ILD. The dielectric layer 60 may be an IMD1 and is formed over the dielectric layer 44 and the source contact plug 38. The metal line 100' in the dielectric layer 60 may be in a bottom metal layer M1. The dielectric layer 64 is formed over the dielectric layer 60. The dielectric layer 64 may adjoin dielectric layer 60 (e.g., no dielectric layer having a metallization disposed between) or one or more dielectric layer having a metallization may be disposed between the dielectric layers 60 and 64. Hence, the dielectric layer 64 may be referred to as an IMDX. The metal line 104 in the dielectric layer 64 may be in an upper metal layer MX. The vias 92 extend continuously from the metal line 104 in the dielectric layer 64 through the dielectric layers 64 and 60 and any intervening dielectric layers to the source contact plug 38. The dielectric layers 60 and 64, metal lines 100' and 104, and vias 92 may be formed similarly as discussed with respect to FIG. 6B.

The metal line 100' has a width in a Z direction and a thickness in a Y direction. The width may be in a plane of a top surface of the dielectric layer 60 and perpendicular to a longitudinal axis of the metal line 100'. The thickness may be in a direction perpendicular to the top surface of the dielectric layer 60. In FIG. 6F, no vias are formed from the metal line 100' to the source contact plug 38. Further, vias may extend from the metal line 100' to different features on the substrate 20. Each of these vias may have a width in an X and/or Z direction. The widths of the vias may be in a direction parallel to the top surface of the dielectric layer 60 and parallel or perpendicular to the longitudinal axis of the metal line 100'. The metal line 100' may be located anywhere in the structure, and the position of metal line 100' in FIG. 6F is for illustrative purposes only.

The metal line 104 has a width in a Z direction and a thickness in a Y direction. The width may be in a plane of a top surface of the dielectric layer 64 and perpendicular to a longitudinal axis of the metal line 104. The thickness may be in a direction perpendicular to the top surface of the dielectric layer 64. The vias 92 may have a width in an X and/or Z direction. The widths of the vias 92 may be in a direction parallel to the top surface of the dielectric layer 64 and parallel or perpendicular to the longitudinal axis of the metal line 104. By using vias 92 directly coupled between the source contact plug 38 and an upper metal layer MX (e.g., the metal line 104), larger dimensions of the vias 92, such as width, and larger dimensions of the metal line 104, such as width and/or thickness, may be employed compared to dimensions of vias extending from a bottom metal layer M1 (e.g., metal line 100') to the substrate 20 and dimensions of the metal line 100'. More particularly, a width and/or thickness of the metal line 104 may be greater than a width and/or thickness, respectively, of the metal line 100', and a width of vias 92 may be greater than a width of vias extending between the metal line 100' and the substrate 20. By allowing for larger dimensions, adverse effects of high currents through the conductive features, such as electromigration, may be reduced.

Figure 6G:
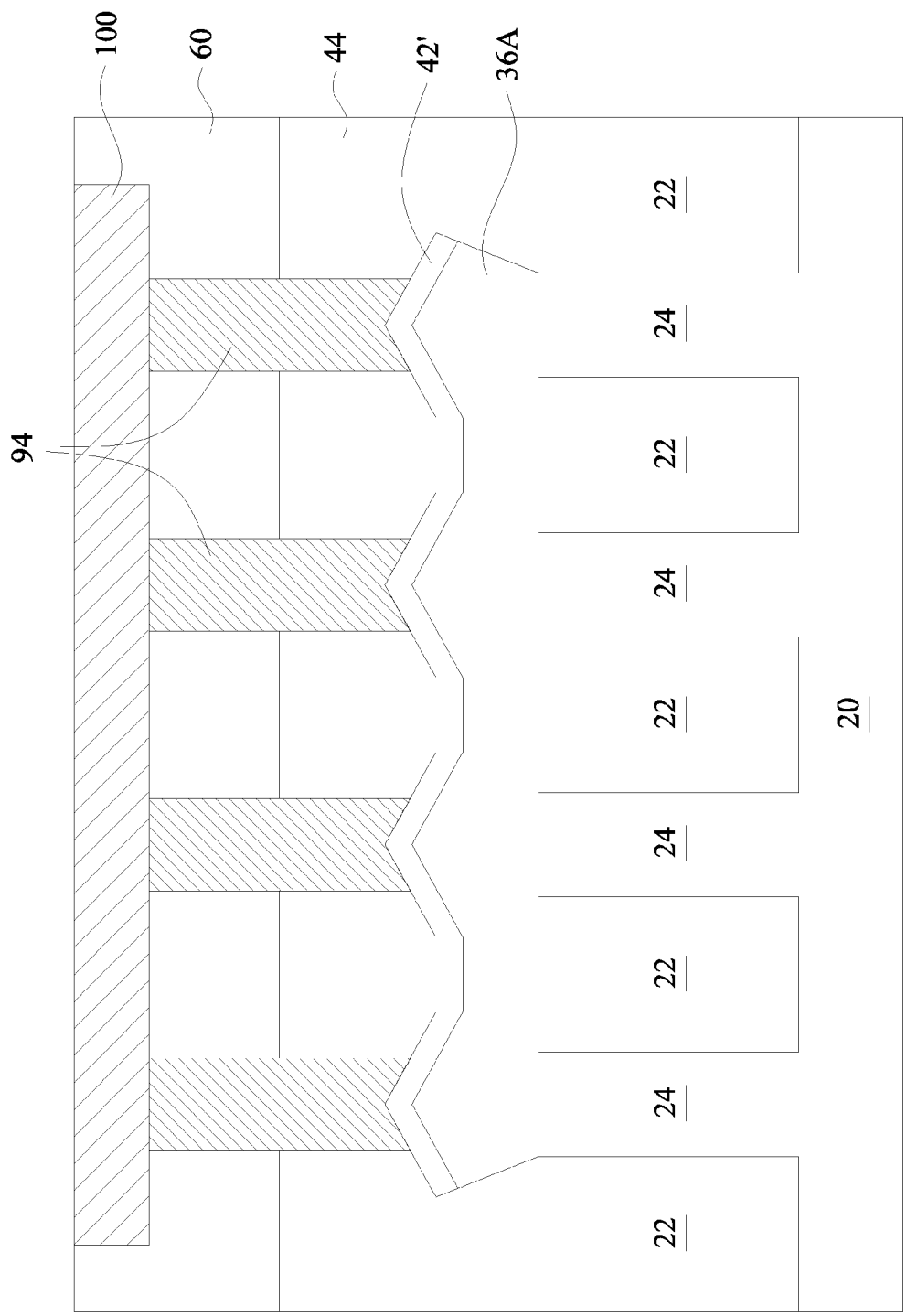

Referring to FIG. 6G, a dielectric layer 60 and a metal line 100 therein are formed on the structure of FIG. 5F, and vias 94 extending continuously through the dielectric layers 60 and 44 to the source silicide regions 42' and/or the source epitaxy regions 36A are formed. The dielectric layer 44 may be an ILD. The dielectric layer 60 may be an IMD1 and is formed over the dielectric layer 44. The metal line 100 in the dielectric layer 60 may be in a bottom metal layer M1. The vias 94 extend from the metal line 100 in the dielectric layer 60 through the dielectric layers 60 and 44 to the source silicide regions 42' and/or the source epitaxy regions 36A. The dielectric layer 60, metal line 100, and vias 94 may be formed similarly as discussed with respect to FIG. 6A.

Figure 6H:
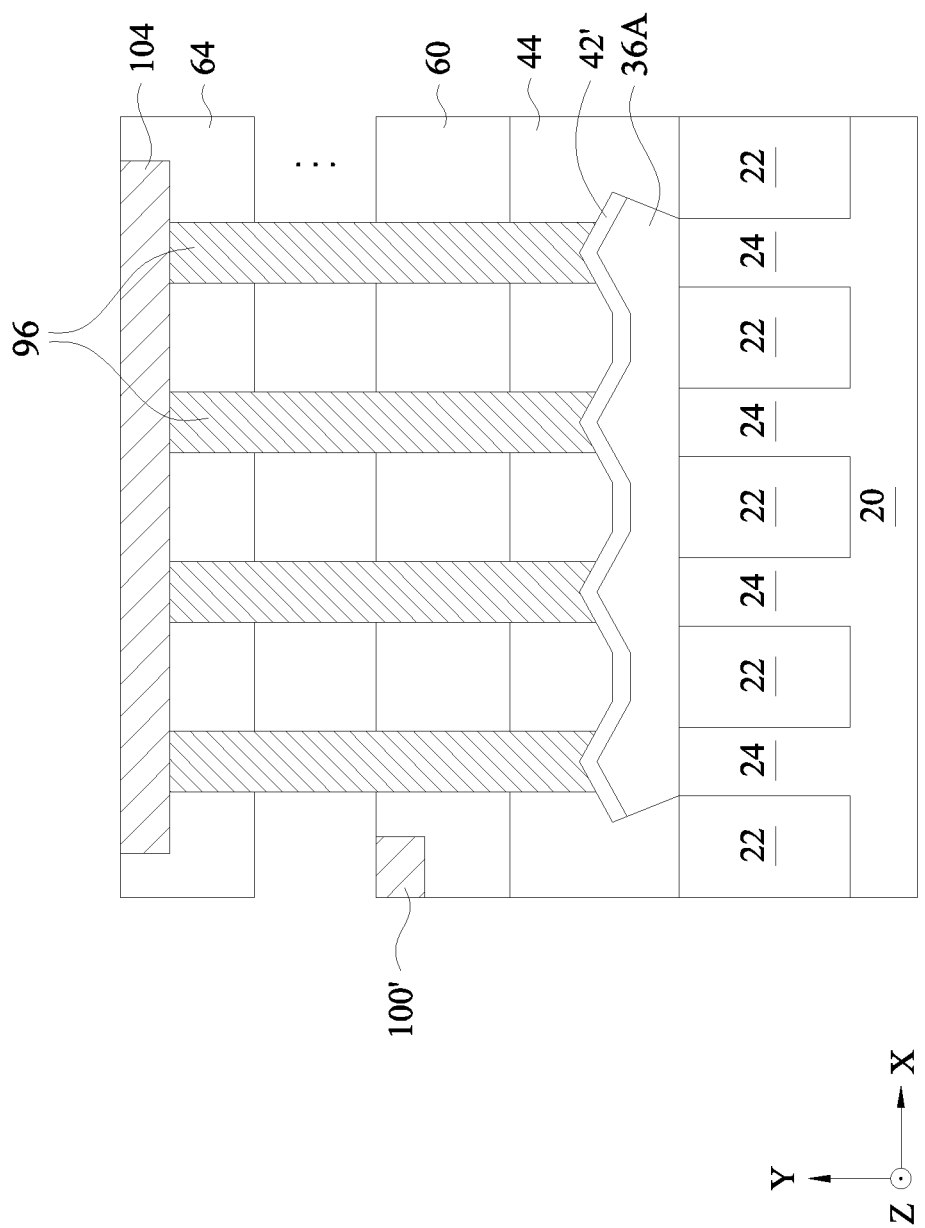

Referring to FIG. 6H, a dielectric layer 60 and a metal line 100' therein are formed on the structure of FIG. 5F; a dielectric layer 64 and a metal line 104 therein are formed over the dielectric layer 60, and vias 96 extending from the metal line 104 through dielectric layers 44, 60, and 64 to the source silicide regions 42' and/or the source epitaxy regions 36A are formed. The dielectric layer 44 may be an ILD. The dielectric layer 60 may be an IMD1 and is formed over the dielectric layer 44. The metal line 100' in the dielectric layer 60 may be in a bottom metal layer M1. The dielectric layer 64 is formed over the dielectric layer 60. The dielectric layer 64 may adjoin dielectric layer 60 (e.g., no dielectric layer having a metallization disposed between) or one or more dielectric layer having a metallization may be disposed between the dielectric layers 60 and 64. Hence, the dielectric layer 64 may be referred to as an IMDX. The metal line 104 in the dielectric layer 64 may be in an upper metal layer MX. The vias 96 extend continuously from the metal line 104 in the dielectric layer 64 through the dielectric layers 64, 60, and 44 and any intervening dielectric layers to the source silicide regions 42' and/or the source epitaxy regions 36A. The dielectric layers 60 and 64, metal lines 100' and 104, and vias 96 may be formed similarly as discussed with respect to FIG. 6B.

The metal line 100' has a width in a Z direction and a thickness in a Y direction. The width may be in a plane of a top surface of the dielectric layer 60 and perpendicular to a longitudinal axis of the metal line 100'. The thickness may be in a direction perpendicular to the top surface of the dielectric layer 60. As with FIG. 6F, in FIG. 6H, no vias are formed from the metal line 100' to the source silicide regions 42' or the source epitaxy regions 36A. Further, vias may extend from the metal line 100' to different features on the substrate 20. Each of these vias may have a width in an X and/or Z direction. The widths of the vias may be in a direction parallel to the top surface of the dielectric layer 60 and parallel or perpendicular to the longitudinal axis of the metal line 100'. The metal line 100' may be located anywhere in the structure, and the position of metal line 100' in FIG. 6H is for illustrative purposes only.

The metal line 104 has a width in a Z direction and a thickness in a Y direction. The width may be in a plane of a top surface of the dielectric layer 64 and perpendicular to a longitudinal axis of the metal line 104. The thickness may be in a direction perpendicular to the top surface of the dielectric layer 64. The vias 96 may have a width in an X and/or Z direction. The widths of the vias 96 may be in a direction parallel to the top surface of the dielectric layer 64 and parallel or perpendicular to the longitudinal axis of the metal line 104. By using vias 96 directly coupled between the source silicide regions 42' and/or the source epitaxy regions 36A and an upper metal layer MX (e.g., the metal line 104), larger dimensions of the vias 96, such as width, and larger dimensions of the metal line 104, such as width and/or thickness, may be employed compared to dimensions of vias extending from a bottom metal layer M1 (e.g., metal line 100') to the substrate 20 and dimensions of the metal line 100'. More particularly, a width and/or thickness of the metal line 104 may be greater than a width and/or thickness, respectively, of the metal line 100', and a width of vias 96 may be greater than a width of vias extending between the metal line 100' and the substrate 20. By allowing for larger dimensions, adverse effects of high currents through the conductive features, such as electromigration, may be reduced.

Figure 7A:
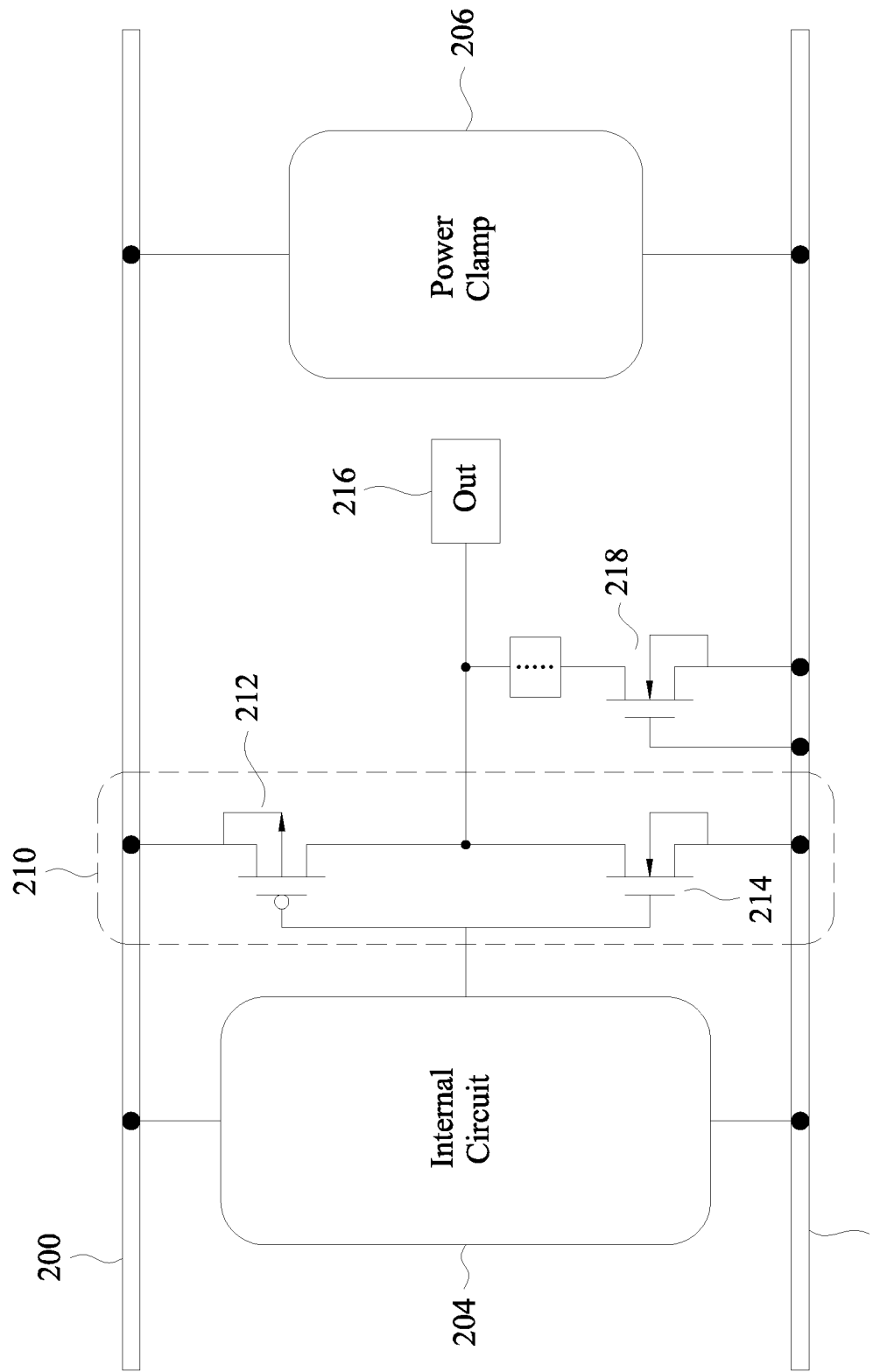
FIGS. 7A, 7B, 8A, and 8B are circuit diagrams of applications in which a FinFET based ESD device may be incorporated in accordance with some exemplary embodiments.
Figure 7B:
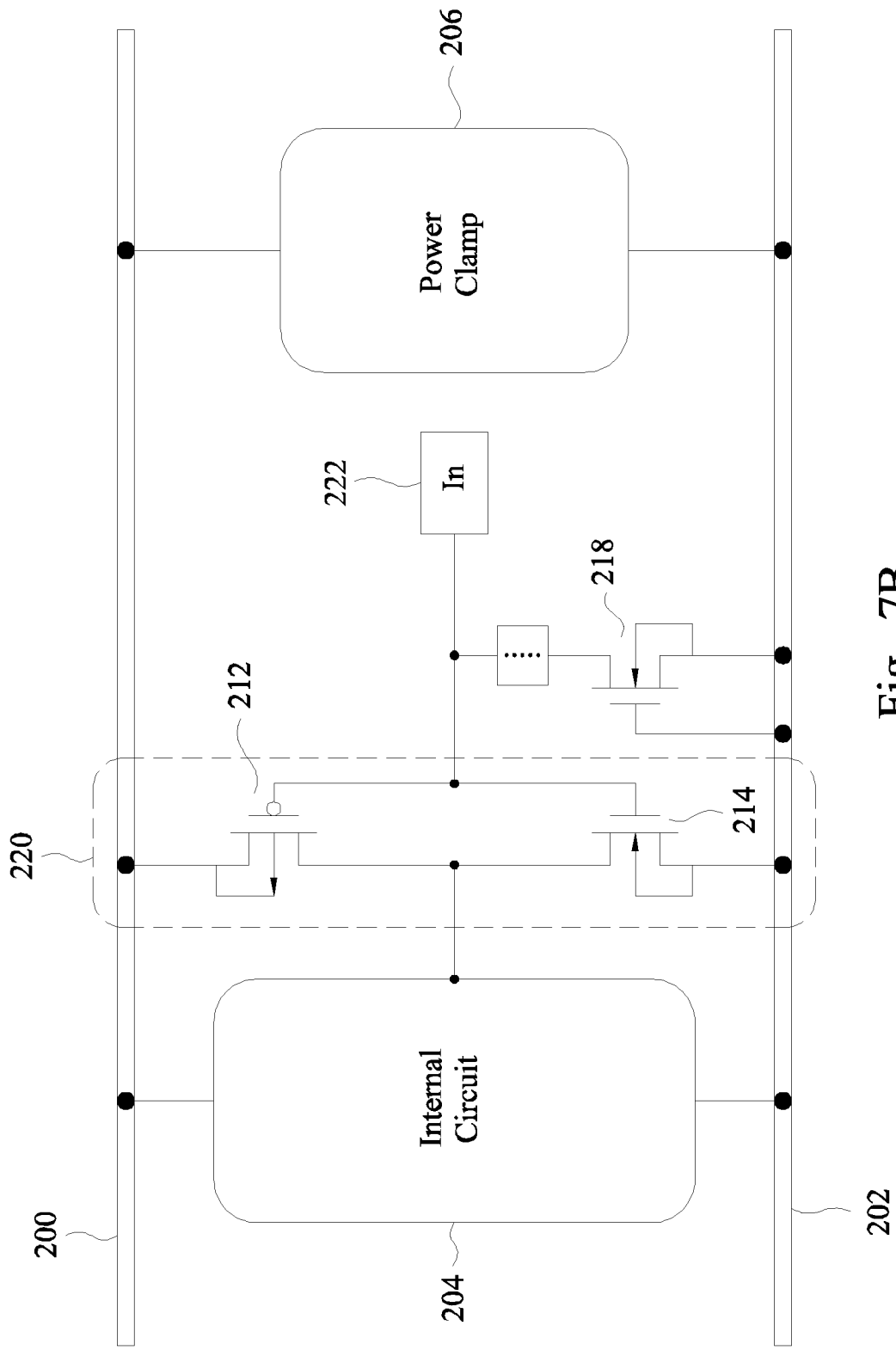
Figure 8A:
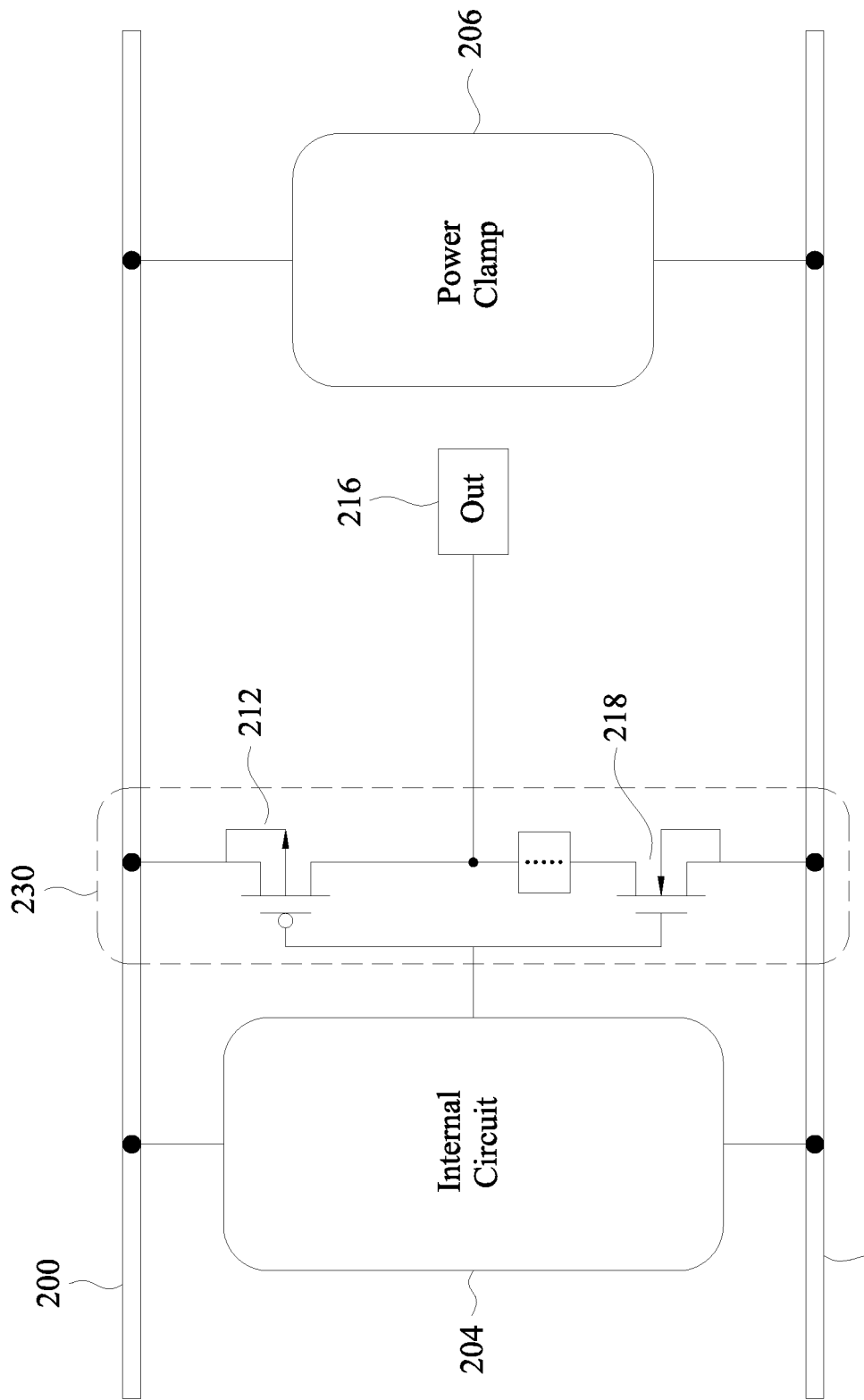
Figure 8B:
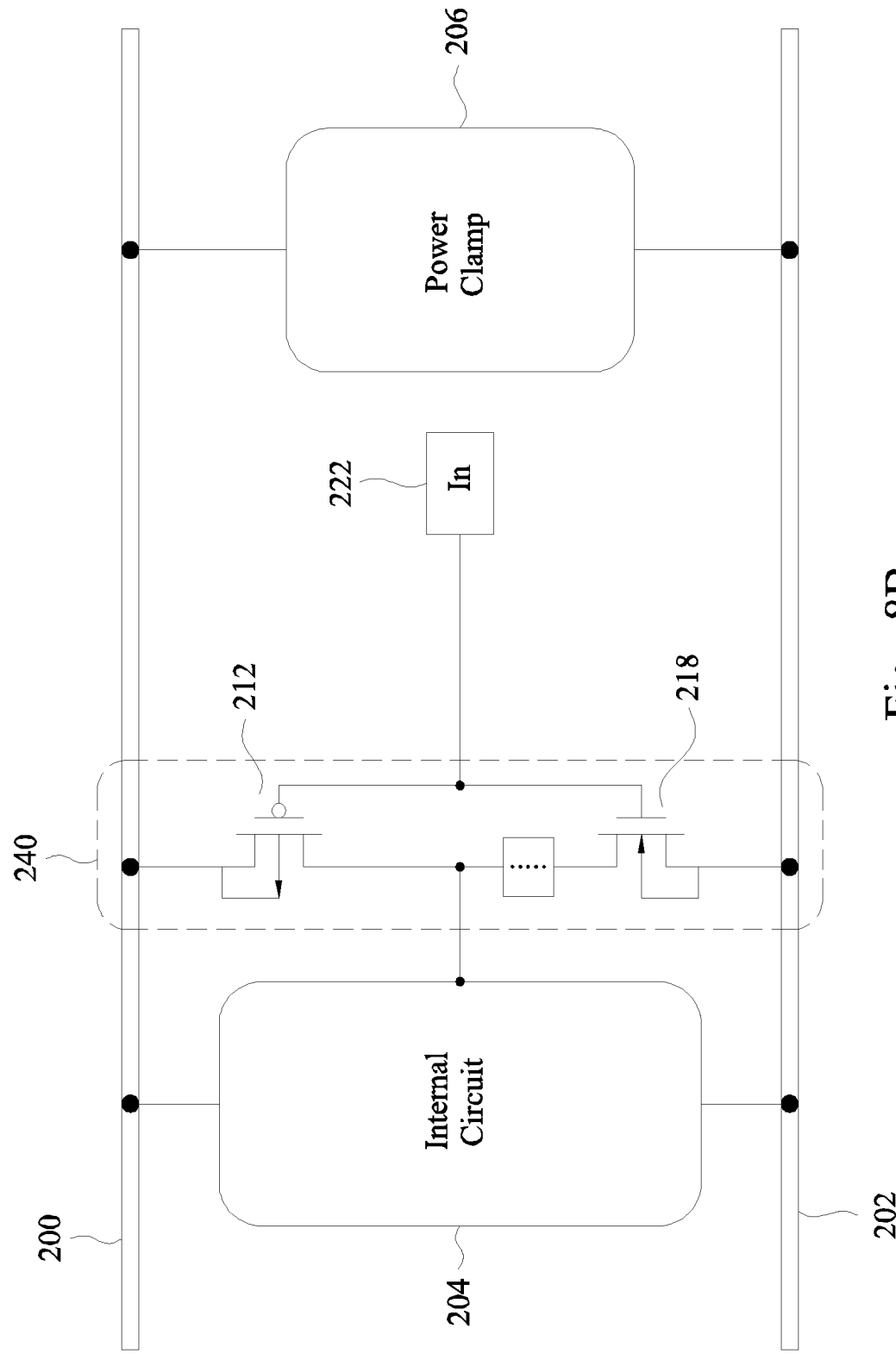

FIGS. 7A through 8B illustrate circuit diagrams of applications in which a FinFET based ESD device may be used. FIGS. 7A and 7B illustrate input and output driver circuits where the FinFET based ESD device is a standalone device. FIGS. 8A and 8B illustrate input and output driver circuits where the FinFET based ESD device is incorporated into the driver circuits. Each of the circuits in FIGS. 7A, 7B, 8A, and 8B comprises a first power rail 200, a second power rail 202, internal circuitry 204 coupled between the power rails 200 and 202, a power clamp 206 coupled between the power rails 200 and 202, and a driver circuit coupled between the power rails 200 and 202. The first power rail 200 may be a VDD node, and the second power rail 202 may be a VSS node.

Referring to FIG. 7A, the driver circuit 210 comprises a p-type transistor 212 and an n-type transistor 214. Each of the transistors 212 and 214 may be FinFETs, planar FETs, or the like. A source of the p-type transistor 212 is coupled to the first power rail 200, and a source of the n-type transistor is coupled to the second power rail 202. Drains of the p-type transistor 212 and the n-type transistor 214 are coupled together and to an output node 216. Gates of the p-type transistor 212 and the n-type transistor 214 are coupled together and to an output node of the internal circuitry 204. A FinFET based ESD device 218, which may be any of the devices discussed above and in this embodiment is an n-type FinFET based ESD device, has a drain coupled to the output node 216, a source coupled to the second power rail 202, and a gate coupled to the source and/or second power rail 202.

Referring to FIG. 7B, the driver circuit 220 comprises a p-type transistor 212 and an n-type transistor 214. Each of the transistors 212 and 214 may be FinFETs, planar FETs, or the like. A source of the p-type transistor 212 is coupled to the first power rail 200, and a source of the n-type transistor is coupled to the second power rail 202. Gates of the p-type transistor 212 and the n-type transistor 214 are coupled together and to an input node 222. Drains of the p-type transistor 212 and the n-type transistor 214 are coupled together and to an input node of the internal circuitry 204. A FinFET based ESD device 218, which may be any of the devices discussed above and in this embodiment is an n-type FinFET based ESD device, has a drain coupled to the input node 222, a source coupled to the second power rail 202, and a gate coupled to the source and/or second power rail 202.

Referring to FIG. 8A, the driver circuit 230 comprises a p-type transistor 212 and a FinFET based ESD device 218, which may be any of the devices discussed above and in this embodiment is an n-type FinFET based ESD device. The p-type transistor 212 may be a FinFET, planar FET, or the like. A source of the p-type transistor 212 is coupled to the first power rail 200, and a source of the FinFET based ESD device 218 is coupled to the second power rail 202. Drains of the p-type transistor 212 and the FinFET based ESD device 218 are coupled together and to an output node 216. Gates of the p-type transistor 212 and the FinFET based ESD device 218 are coupled together and to an output node of the internal circuitry 204.

Referring to FIG. 8B, the driver circuit 240 comprises a p-type transistor 212 and a FinFET based ESD device 218, which may be any of the devices discussed above and in this embodiment is an n-type FinFET based ESD device. The p-type transistor 212 may be a FinFET, planar FET, or the like. A source of the p-type transistor 212 is coupled to the first power rail 200, and a source of the FinFET based ESD device 218 is coupled to the second power rail 202. Gates of the p-type transistor 212 and the FinFET based ESD device 218 are coupled together and to an input node 222. Drains of the p-type transistor 212 and the FinFET based ESD device 218 are coupled together and to an input node of the internal circuitry 204.

One of ordinary skill in the art will readily understand that a p-type FinFET based ESD device can be used with the drivers in FIGS. 7A, 7B, 8A, and 8B. For example, in FIGS. 7A and 7B, a p-type FinFET based ESD device can replace the FinFET based ESD device 218 and have its source and drain coupled to the first power rail 200 instead of the second power rail 202. In FIGS. 8A and 8B, a p-type FinFET based ESD device can replace the p-type transistor 212 with similar connections, and an n-type transistor (such as n-type transistor 214 in FIGS. 7A and 7B) can replace the FinFET based ESD device 218 with similar connections.

Figure 9A:
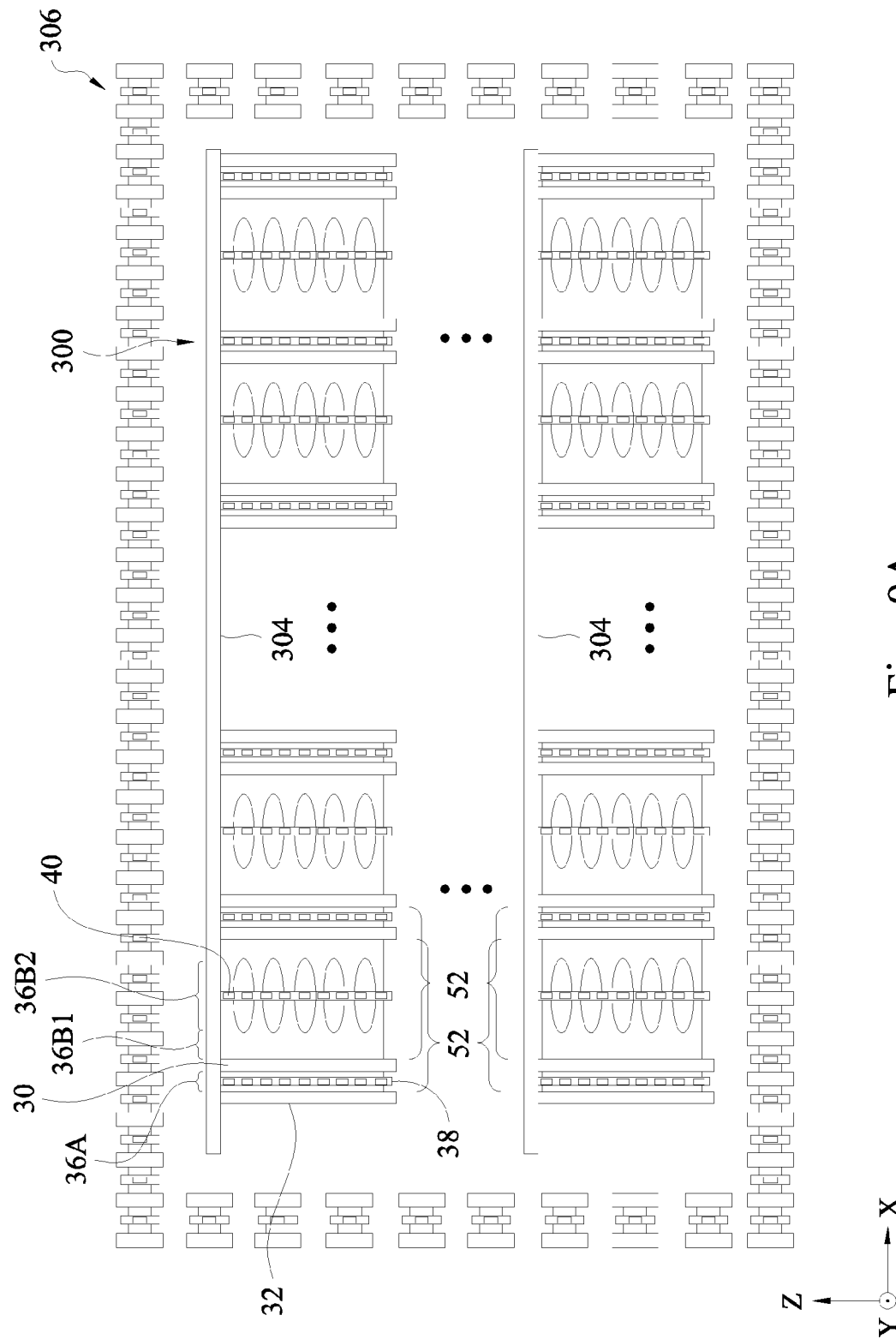
FIGS. 9A through 9D are layouts of a FinFET based ESD device in accordance with some exemplary embodiments.

FIGS. 9A through 9D illustrate example layouts of a FinFET based ESD device 300 in accordance with some embodiments. Referring to FIG. 9A, the ESD device 300 comprises any number of FinFETs 52. The FinFETs 52 are illustrated in perspective view in FIG. 5A, for example. The pattern of the FinFETs 52 can be repeated any number of times throughout the area of the device 300, for example, to create an array. Gate connectors 304 may be formed on metal layer M0 (e.g., the same metal layer as contact plugs 38 and 40), which may be formed at least partially on the STI regions 22. The gate connectors 304 electrically couple gate stacks 30 and 32 of the FinFETs 52 together.

A pick-up device 306 encircles the ESD device 300. The pick-up device 306 comprises one or more highly doped wells that may be the same conductivity type of the underlying substrate 20. For example, if the substrate 20 is lightly p-doped, the wells of the pick-up device 306 may be highly p-doped. Dummy gate structures may be formed over the highly doped well(s) for layout uniformity purposes, for example. The highly doped wells may include epitaxy regions formed during the formation of the epitaxy semiconductor material 36, and silicide and/or contact plugs may be formed on these epitaxy regions during the formation of silicide and/or contact plugs on the epitaxy semiconductor material 36.

Figure 9B:
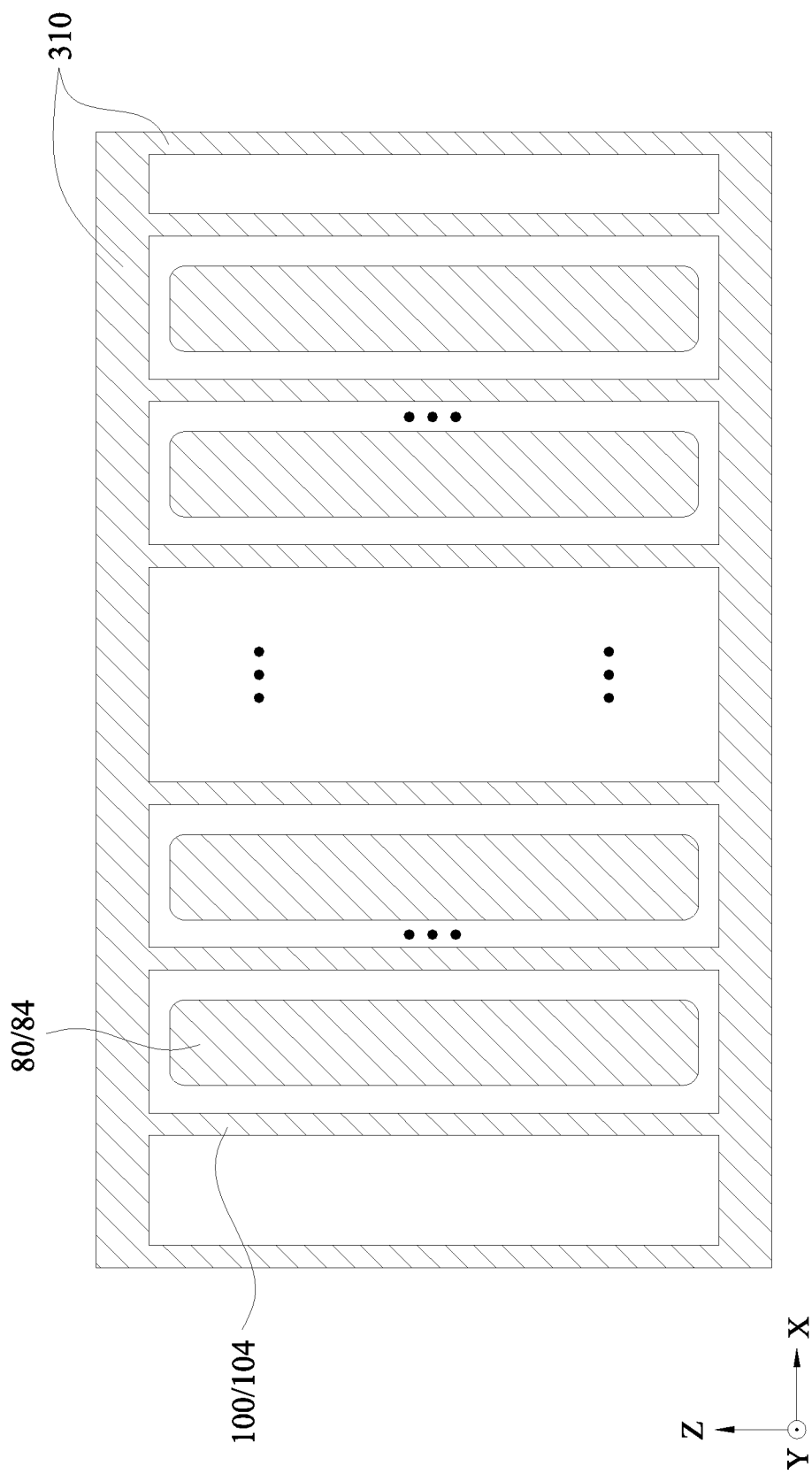

FIG. 9B illustrates a metal layer M1 or MX, which may be the metal layers discussed above with respect to FIGS. 6A through 6H. The metal layer M1 or MX includes metal lines 80/84 and 100/104 that are discussed above with respect to FIGS. 6A through 6H. Vias may extend from these metal lines to respective features as discussed in FIG. 6A through 6H. The metal layer M1 or MX further includes a portion 310 encircling the area of the ESD device 300 that corresponds to the pick-up device 306. Vias may extend from the portion 310 to the pick-up device 306 to electrically couple the pick-up device 306 to the portion 310 of the metal layer M1 or MX. The gate connectors 304 may be electrically coupled to source contact plugs 38, source silicide regions 42', and/or source epitaxy region 36A through a connection on metal layer M0 or through vias electrically coupled between the gate connectors 304 and the metal lines 100/104.

Figure 9C:
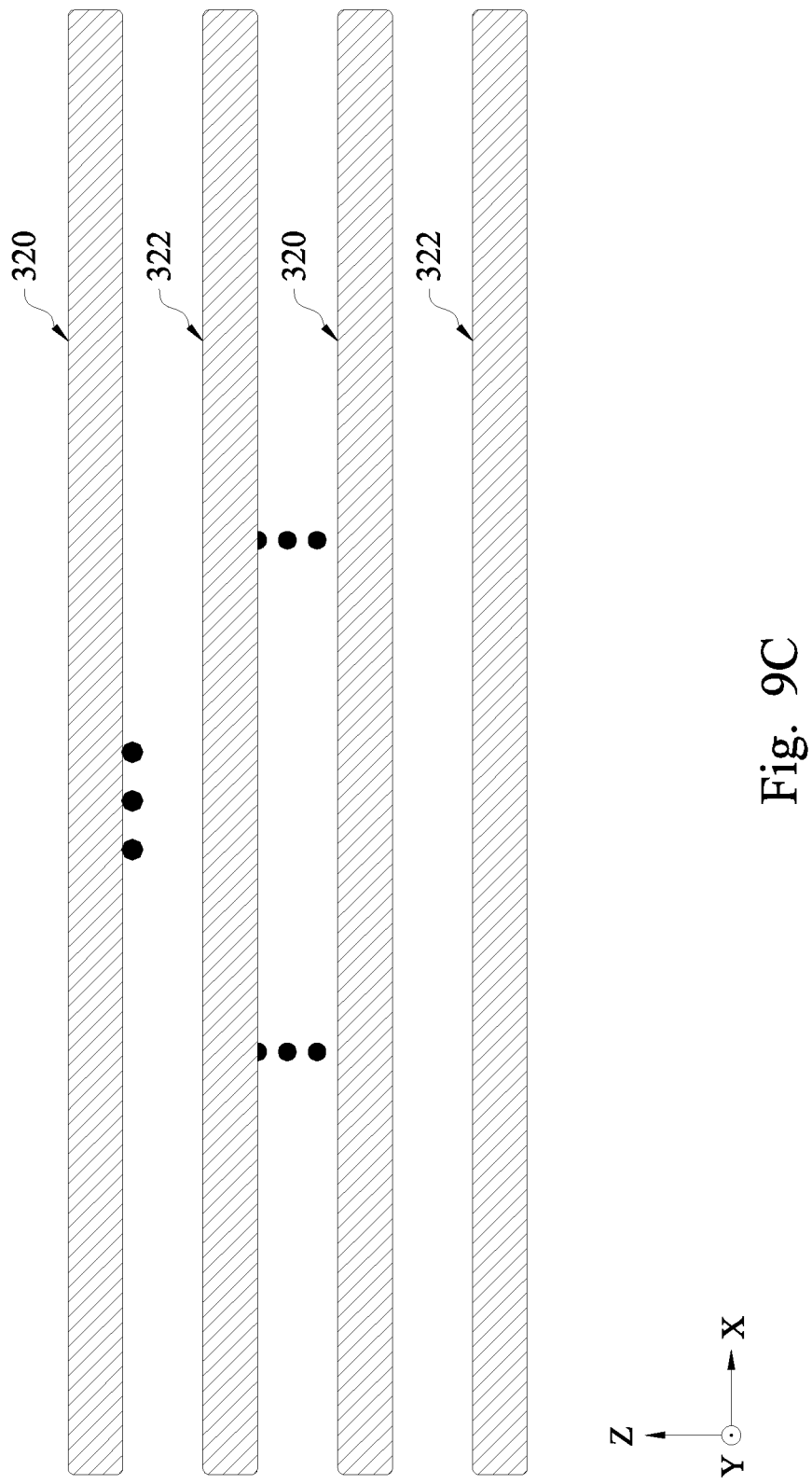

FIG. 9C illustrates a metal layer MZ that is above the metal layer M1 or MX of FIG. 9B. Any number of metal layers may be disposed between the metal layer M1 or MX of FIG. 9B and the metal layer MZ of FIG. 9C. The metal layer MZ comprises metal lines 320 and 322. Metal lines 320 may be for an input/output node, e.g., nodes 216 and 222 in FIGS. 7A, 7B, 8A, and 8B. Metal lines 322 may be for a power rail node, e.g., the second power rail 202, such as VSS, in FIGS. 7A, 7B, 8A, and 8B. Metal lines 320 may be electrically coupled to metal lines 80/84 in metal layer M1 or MX using vias. Metal lines 322 may be electrically coupled to metal lines 100/104 and portion 310 in metal layer M1 or MX using vias.

Figure 9D:
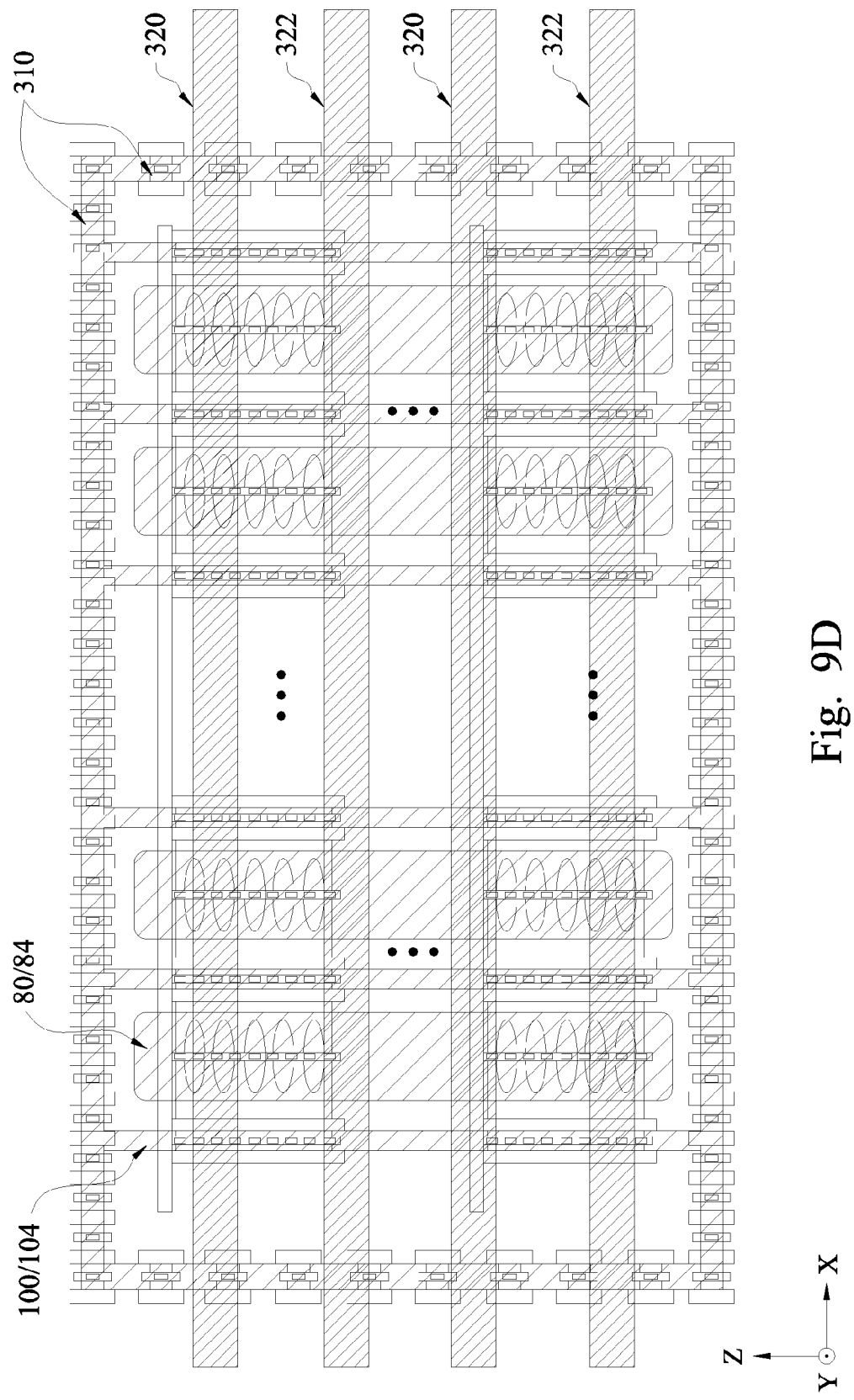

FIG. 9D illustrates the overlay of the various layers and components discussed in FIGS. 9A through 9C. By forming the components as discussed, a standalone FinFET based ESD device 218 in FIGS. 7A and 7B may be formed and utilized in the circuits of FIGS. 7A and 7B. One of ordinary skill in the art will readily understand various modifications that may be made to this layout. For example, the gate connectors 304 may not be electrically coupled to the source epitaxy regions 36A, and landing pads may be formed in the metal layer M1 or MX of FIG. 9B with vias extending from the landing pads to the gate connectors 304. Further, an additional metal line may be formed in the metal layer MZ of FIG. 9B with vias extending from the metal line to the landing pads. In this manner, the additional metal line may be for an input node to a driver circuit, e.g., input to the driver circuit 230 and 240 from internal circuitry 204 or from input node 222 in FIGS. 8A and 8B, and the metal lines 320 may be for an output node from the driver circuit, e.g., output from the driver circuit 230 and 240 to output node 216 or to the internal circuitry 204 in FIGS. 8A and 8B. Additionally, the layouts in FIGS. 9A through 9D may be discussed in the context of n-type FinFETs, and one of ordinary skill in the art will readily understand that the discussion above can apply to p-type FinFETs, for example, by changing doping types and by changing the nodes of some metal lines, such as by changing metal lines 322 to be a power rail node, e.g., the first power rail 200, such as VDD, in FIGS. 7A, 7B, 8A, and 8B.

In some embodiments, by forming a non-merging drain epitaxy region, the drain resistance of ESD device 50 may be increased. A plurality of ESD devices 50 may thus be turned on more uniformly. Further, by using a plurality of vias to electrically couple each of the source and drain regions, and/ or by using vias with larger dimensions, current can be routed from the ESD device with a reduced likelihood of adverse effects, such as electromigration as a result of the current. Further, by using multiple FinFETs in an ESD device, current may be routed in parallel through multiple FinFETs, which may reduce a current through any individual component.

In accordance with embodiments, a device includes a plurality of STI regions, a plurality of semiconductor strips between the STI regions and parallel to each other, and a plurality of semiconductor fins over the semiconductor strips. A gate stack is disposed over and crossing the plurality of semiconductor fins. A drain epitaxy semiconductor region is disposed on a side of the gate stack and connected to the plurality of semiconductor fins. The drain epitaxy semiconductor region includes a first portion adjoining the plurality of semiconductor fins, wherein the first portion forms a continuous region over and aligned to the plurality of semiconductor strips. The drain epitaxy semiconductor region further includes second portions farther away from the gate stack than the first portion. Each of the second portions is over and aligned to one of the plurality of semiconductor strips. The second portions are parallel to each other, and are separated from each other by a dielectric material.

In accordance with other embodiments, a device includes a plurality of STI regions, a plurality of semiconductor strips between the plurality of STI regions and parallel to each other, and a plurality of semiconductor fins over the plurality semiconductor strips. A first gate stack and a second stack are disposed over and crossing the plurality of semiconductor fins. A drain epitaxy semiconductor region is in between the first gate stack and the second gate stack. The drain epitaxy semiconductor region forms continuous drain regions in regions close to the first and the second gate stacks, and splits into a plurality of epitaxy strips in a region close to the middle of the first and the second gate stacks.

In accordance with yet other embodiments, a method includes performing an epitaxy to grow a plurality of epitaxy regions from a plurality of semiconductor strips that are between a plurality of STI regions. The epitaxy is continued, so that first portions of the plurality of epitaxy regions close to a gate stack are merged into a continuous drain epitaxy region, and second portions of the plurality of epitaxy regions farther away from the gate stack than the first portions are separate from each other. When the second portions of the plurality of epitaxy regions are separate from each other, a contact plug is formed to electrically connect to the second portions of the plurality of epitaxy regions.

In accordance with further embodiments, a semiconductor device comprises semiconductor fins on semiconductor strips on a substrate. The semiconductor fins are parallel to each other. The semiconductor device also comprises a gate stack over the semiconductor fins and a drain epitaxy semiconductor region disposed laterally from a side of the gate stack and on the semiconductor strips. A first dielectric layer is over the substrate, and the first dielectric layer has a first metal layer. A second dielectric layer is over the first dielectric layer, and the second dielectric layer has a second metal layer. Vias extend from the second metal layer and through the first dielectric layer, and the vias are electrically coupled to the drain epitaxy semiconductor region.

In accordance with further embodiments, a device comprises a first fin field effect transistor (finFET) and a second finFET. The first finFET comprises a first plurality of semiconductor fins on a first plurality of semiconductor strips on a substrate, a first gate stack over the first plurality of semiconductor fins, and a first drain epitaxy semiconductor region on the first plurality of semiconductor strips. The first drain epitaxy semiconductor region has a first thickness proximate the first gate stack and a second thickness distal from the first gate stack, and the first thickness is greater than the second thickness. The second finFET comprises a second plurality of semiconductor fins on a second plurality of semiconductor strips on the substrate, a second gate stack over the second plurality of semiconductor fins, and a second drain epitaxy semiconductor region on the second plurality of semiconductor strips. The second gate stack is physically separated and distinct from the first gate stack, and the first gate stack is electrically coupled to the second gate stack. The second drain epitaxy semiconductor region has a third thickness proximate the second gate stack and a fourth thickness distal from the second gate stack, and the third thickness is greater than the fourth thickness. The first drain epitaxy semiconductor region is electrically coupled to the second drain epitaxy semiconductor region.

In accordance with further embodiments, a device comprises a plurality of active regions parallel to each other on a substrate, a first gate stack and a second gate stack over and crossing the plurality of active regions, and a drain epitaxy semiconductor region on the plurality of active regions and between the first gate stack and the second gate stack. A first region of the drain epitaxy semiconductor region proximate the first gate stack has a first thickness greater than a second thickness of a second region of the drain epitaxy semiconductor region disposed approximately equidistance between the first gate stack and the second gate stack. A third region of the drain epitaxy semiconductor region proximate the second gate stack has a third thickness greater than the second thickness.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device comprising:
   semiconductor fins on semiconductor strips on a substrate, the semiconductor fins being parallel to each other;
   a gate stack over the semiconductor fins;
   a drain epitaxy semiconductor region disposed laterally from a side of the gate stack and on the semiconductor strips, wherein the drain epitaxy semiconductor region further comprises:
      a first portion proximate the gate stack; and
      second portions distally disposed from the gate stack relative to the first portion, a thickness of the first portion being greater than a thickness of the second portions;
   a first dielectric layer over the substrate, the first dielectric layer having a first metal layer;
   a second dielectric layer over the first dielectric layer, the second dielectric layer having a second metal layer; and
   first vias extending from the second metal layer and through the first dielectric layer, the first vias being electrically coupled to the drain epitaxy semiconductor region.

2. The semiconductor device of claim 1 further comprising a drain contact plug on the drain epitaxy semiconductor region, the first vias being directly coupled to the drain contact plug.

3. The semiconductor device of claim 1 further comprising silicide on the drain epitaxy semiconductor region, the first vias being directly coupled to the silicide.

4. The semiconductor device of claim 1 further comprising a source epitaxy semiconductor region, wherein the drain epitaxy semiconductor region and the source epitaxy semiconductor region are on opposite lateral sides of the gate stack, and wherein the source epitaxy semiconductor region is a continuous region on the semiconductor strips, and the drain epitaxy semiconductor region has a continuous region and a non-continuous region on the semiconductor strips.

5. The semiconductor device of claim 1 further comprising silicide on a first portion of the drain epitaxy semiconductor region, the silicide not being on a second portion of the drain epitaxy semiconductor region.

6. The semiconductor device of claim 1 further comprising second vias extending from the first metal layer towards the substrate, a width of the first vias being greater than a width of the second vias.

7. The semiconductor device of claim 1, wherein the semiconductor fins are part of an electrostatic discharge device.

8. A device comprising:
   a first fin field effect transistor (finFET) comprising:
      a first plurality of semiconductor fins on a first plurality of semiconductor strips on a substrate,
      a first gate stack over the first plurality of semiconductor fins, and
      a first drain epitaxy semiconductor region on the first plurality of semiconductor strips, the first drain epitaxy semiconductor region having a first thickness proximate the first gate stack and a second thickness distal from the first gate stack, the first thickness being greater than the second thickness; and
   a second finFET comprising:
      a second plurality of semiconductor fins on a second plurality of semiconductor strips on the substrate,
      a second gate stack over the second plurality of semiconductor fins, the second gate stack being physically separated and distinct from the first gate stack, wherein the first gate stack is electrically coupled to the second gate stack, and
      a second drain epitaxy semiconductor region on the second plurality of semiconductor strips, the second drain epitaxy semiconductor region having a third thickness proximate the second gate stack and a fourth thickness distal from the second gate stack, the third thickness being greater than the fourth thickness, wherein the first drain epitaxy semiconductor region is electrically coupled to the second drain epitaxy semiconductor region.

9. The device of claim 8, wherein the first finFET comprises a first source epitaxy semiconductor region on the first plurality of semiconductor strips on an opposite side of the first gate stack from the first drain epitaxy semiconductor region, and the second finFET comprises a second source epitaxy semiconductor region on the second plurality of semiconductor strips on an opposite side of the second gate stack from the second drain epitaxy semiconductor region, the first source epitaxy semiconductor region being electrically coupled to the second source epitaxy semiconductor region.

10. The device of claim 8, wherein the first drain epitaxy region and the second drain epitaxy region are electrically coupled to an input node, an output node, or a combination thereof.

11. The device of claim 8, wherein the first gate stack and the second gate stack are electrically coupled to a power rail node.

12. The device of claim 8, wherein the first gate stack and the second gate stack are electrically coupled to an input node, an output node, or a combination thereof.

13. The device of claim 8 further comprising:
   a first metal layer in a first dielectric layer over the substrate; and
   a second metal layer in a second dielectric layer, the second metal layer being over the first metal layer; and
   vias extending from the second metal layer and through the first dielectric layer, the vias being electrically coupled to the first drain epitaxy region.

14. The device of claim 8, wherein a first portion of the first drain epitaxy region includes merged portions on the first plurality of semiconductor strips proximate the first gate stack, and a second portion of the first drain epitaxy region includes unmerged portions on the first plurality of semiconductor strips distal from the first gate stack.

15. A device comprising:
- a plurality of active regions parallel to each other on a substrate;
- a first gate stack and a second gate stack over and crossing the plurality of active regions; and
- a drain epitaxy semiconductor region on the plurality of active regions and between the first gate stack and the second gate stack, a first region of the drain epitaxy semiconductor region proximate the first gate stack having a first thickness greater than a second thickness of a second region of the drain epitaxy semiconductor region disposed approximately equidistance between the first gate stack and the second gate stack, a third region of the drain epitaxy semiconductor region proximate the second gate stack having a third thickness greater than the second thickness.

16. The device of claim 15 further comprising a first source epitaxy semiconductor region and a second source epitaxy semiconductor region, the first source epitaxy semiconductor region being on the plurality of active regions and on a side opposite the first gate stack from the drain epitaxy semiconductor region, the second source epitaxy semiconductor region being on the plurality of active regions and on a side opposite the second gate stack from the drain epitaxy semiconductor region.

17. The device of claim 15 further comprising a drain contact plug on the second region of the drain epitaxy semiconductor region.

18. The device of claim 15, wherein the first region comprises a first merged portion of the drain epitaxy semiconductor region, the third region comprises a second merged portion of the drain epitaxy semiconductor region, and the second region comprises unmerged portions of the drain epitaxy semiconductor region.

19. The device of claim 15 further comprising silicide on the second region of the drain epitaxy semiconductor region, no silicide being on the first region and the third region of the drain epitaxy semiconductor region.

20. The device of claim 15 further comprising:
- a first metal layer in a first dielectric layer over the substrate; and
- a second metal layer in a second dielectric layer, the second metal layer being over the first metal layer; and
- vias extending from the second metal layer and through the first dielectric layer, the vias being electrically coupled to the drain epitaxy semiconductor region.

* * * * *